(12) United States Patent
Cho et al.

(10) Patent No.: US 12,167,636 B2
(45) Date of Patent: Dec. 10, 2024

(54) DISPLAY PANEL AND DISPLAY APPARATUS

(71) Applicant: Samsung Display Co., Ltd., Yongin-si (KR)

(72) Inventors: Seongmin Cho, Yongin-si (KR);
Yunkyeong In, Yongin-si (KR);
Beohmrock Choi, Yongin-si (KR);
Hyeyun Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 423 days.

(21) Appl. No.: 17/488,230

(22) Filed: Sep. 28, 2021

(65) Prior Publication Data

US 2022/0208863 A1 Jun. 30, 2022

(30) Foreign Application Priority Data

Dec. 30, 2020 (KR) ........................ 10-2020-0188068

(51) Int. Cl.
| | | |
|---|---|---|
| *H10K 59/121* | (2023.01) | |
| *H10K 50/86* | (2023.01) | |
| *H10K 59/122* | (2023.01) | |
| *H10K 59/126* | (2023.01) | |
| *H10K 59/38* | (2023.01) | |

(Continued)

(52) U.S. Cl.
CPC ........... *H10K 59/121* (2023.02); *H10K 50/86* (2023.02); *H10K 59/122* (2023.02); *H10K 59/126* (2023.02); *H10K 59/38* (2023.02); *H10K 59/40* (2023.02); *H10K 59/65* (2023.02); *G06F 3/0412* (2013.01); *G09G 3/3233* (2013.01);

(Continued)

(58) Field of Classification Search
CPC .... H10K 59/121; H10K 50/86; H10K 59/122; H10K 59/126; H10K 59/38; H10K 59/40; H10K 59/65; H10K 50/865; H10K 59/12; H10K 59/131; H10K 59/00; G06F 3/0412; G06F 3/0446; G06F 2203/04102; G06F 2203/04103; G06F 2203/04112; G09G 3/3233; G09G 2300/0426; G09G 2300/0452; G09G 2300/0842; G09G 3/2003; G09G 3/3241; G09G 2310/0251
See application file for complete search history.

(56) References Cited

U.S. PATENT DOCUMENTS 8,106,583 B2 1/2012 Shin et al.
8,664,021 B2 3/2014 Kim et al.
(Continued)

FOREIGN PATENT DOCUMENTS

| JP | 2010-230797 | 10/2020 |
|---|---|---|
| KR | 10-2017-0113066 | 10/2017 |
| KR | 10-2018-0092003 | 8/2018 |

*Primary Examiner* — Kyoung Lee
(74) *Attorney, Agent, or Firm* — KILE PARK REED & HOUTTEMAN PLLC

(57) ABSTRACT

A display panel includes a first display area where first light-emitting diodes; a second display area at least partially surrounded by the first display area and where second light-emitting diodes, wherein hole regions are defined between the second light-emitting diodes in the second display area, a pixel-defining layer and a light-shielding layer include openings respectively corresponding to the hole regions, and circuit devices forming second pixel circuits and wires connected to the second pixel circuits are not provided in each of the hole regions.

20 Claims, 20 Drawing Sheets

(51) Int. Cl.
  *H10K 59/40* (2023.01)
  *H10K 59/65* (2023.01)
  *G06F 3/041* (2006.01)
  *G09G 3/3233* (2016.01)
(52) U.S. Cl.
  CPC ............... *G09G 2300/0426* (2013.01); *G09G 2300/0452* (2013.01); *G09G 2300/0842* (2013.01)

(56) References Cited

U.S. PATENT DOCUMENTS

| | | |
|---|---|---|
| 8,866,170 B2 | 10/2014 | Moon et al. |
| 10,803,283 B2 | 10/2020 | Han |
| 2020/0380914 A1 | 12/2020 | Jung et al. |
| 2022/0149135 A1* | 5/2022 | Choi ..................... H10K 59/38 |

* cited by examiner

DISPLAY PANEL AND DISPLAY APPARATUS

CROSS-REFERENCE TO RELATED APPLICATION

This application claims priority from and the benefit of Korean Patent Application No. 10-2020-0188068, filed on Dec. 30, 2020, which is hereby incorporated by reference for all purposes as if fully set forth herein.

BACKGROUND

Field

Embodiments of the inventive concepts relate generally to a display panel and a display apparatus including the same.

Discussion of the Background

Recently, the purposes of a display apparatus have diversified. Also, a thickness and weight of the display apparatus have been decreasing, and thus, the range of uses thereof have diversified.

As the display apparatus is used for various purposes, there may be various methods of designing a shape of the display apparatus, and functions that may be grafted or linked to the display apparatus have increased.

The above information disclosed in this Background section is only for understanding of the background of the inventive concepts, and, therefore, it may contain information that does not constitute prior art

SUMMARY

Devices constructed according to embodiments of the invention are capable of providing a display panel having transmittance built into a region where a component is arranged, and a display apparatus including the display panel. However, this is only an example and the scope of the inventive concepts are not limited thereby.

Additional features of the inventive concepts will be set forth in the description which follows, and in part will be apparent from the description, or may be learned by practice of the inventive concepts.

According to one or more embodiments of the inventive concepts, a display panel includes: a first display area where first light-emitting diodes and first pixel circuits connected to the first light-emitting diodes are arranged; a second display area at least partially surrounded by the first display area and where second light-emitting diodes and second pixel circuits connected to the second light-emitting diodes are arranged; a pixel-defining layer defining an emission area of each of the first light-emitting diodes and the second light-emitting diodes; and an antireflection layer arranged on the first light-emitting diodes and the second light-emitting diodes and including a light-shielding layer and color filters, wherein hole regions are defined between the second light-emitting diodes in the second display area, the pixel-defining layer and the light-shielding layer include openings respectively corresponding to the hole regions, and circuit devices forming the second pixel circuits and wires connected to the second pixel circuits are disposed in the second display area but not in each of the hole regions.

The pixel-defining layer may be a light-shielding insulating layer.

The pixel-defining layer may include first openings corresponding to the first light-emitting diodes, second openings corresponding to the second light-emitting diodes, and third openings corresponding to the hole regions, and the light-shielding layer may include fourth openings overlapping the first openings, fifth openings overlapping the second openings, and sixth openings overlapping the third openings.

The color filters may be located at the fourth openings and the fifth openings.

The antireflection layer may further include an overcoated layer arranged on the light-shielding layer and the color filters, wherein at least a portion of the overcoated layer may be located at the sixth openings.

Each of the first light-emitting diodes and the second light-emitting diodes may include: a first electrode; an emission layer on the first electrode; and a second electrode on the emission layer, wherein the second electrode may be integrated to correspond to the first light-emitting diodes and the second light-emitting diodes.

The second electrode may include openings corresponding to the hole regions.

A resolution of the first display area and a resolution of the second display area may be the same.

According to one or more embodiments of the inventive concepts, a display panel includes: a first display area where first light-emitting diodes and first pixel circuits connected to the first light-emitting diodes are arranged; a second display area at least partially surrounded by the first display area and where second light-emitting diodes and second pixel circuits connected to the second light-emitting diodes are arranged; a pixel-defining layer defining an emission area of each of the first light-emitting diodes and the second light-emitting diodes; and an antireflection layer arranged on the first light-emitting diodes and the second light-emitting diodes and including a light-shielding layer and color filters, wherein hole regions are defined between the first light-emitting diodes and between the second light-emitting diodes in the first display area and the second display area, the pixel-defining layer includes openings corresponding to the hole regions of the first display area and the second display area, the light-shielding layer includes openings corresponding to the hole regions of the second display area, and first circuit devices forming the first pixel circuits and wires connected to the first pixel circuits are provided in the first display area but not in each of the hole regions of the first display area, and second circuit devices forming the second pixel circuits and wires connected to the second pixel circuits are provided in the second display area but not in each of the hole regions of the second display area.

The pixel-defining layer may be a light-shielding insulating layer.

The pixel-defining layer may include first openings corresponding to the first light-emitting diodes, second openings corresponding to the second light-emitting diodes, and third openings corresponding to the hole regions, and the light-shielding layer may include fourth openings overlapping the first openings, fifth openings overlapping the second openings, and sixth openings overlapping the third openings of the second display area.

The color filters may be located at the fourth openings and the fifth openings.

The antireflection layer may further include an overcoated layer arranged on the light-shielding layer and the color filters, wherein at least a portion of the overcoated layer may be located at the sixth openings.

Each of the first light-emitting diodes and the second light-emitting diodes may include: a first electrode; an emission layer on the first electrode; and a second electrode on the emission layer, wherein the second electrode may be integrated to correspond to the first light-emitting diodes and the second light-emitting diodes.

The second electrode may include openings corresponding to the hole regions.

A resolution of the first display area and a resolution of the second display area may be the same.

According to one or more embodiments of the inventive concepts, a display apparatus includes: a display panel including a first display area where first light-emitting diodes are arranged and a second display area where second light-emitting diodes are arranged; and a component arranged on a lower surface of the display panel and overlapping the second display area, wherein the display panel includes: a pixel-defining layer defining an emission area of each of the first light-emitting diodes and the second light-emitting diodes; and an antireflection layer arranged on the first light-emitting diodes and the second light-emitting diodes and including a light-shielding layer and color filters, wherein first hole regions are defined between the second light-emitting diodes in the second display area, the pixel-defining layer and the light-shielding layer include openings respectively corresponding to the first hole regions, and first circuit devices forming the second pixel circuits and wires connected to the second pixel circuits are disposed in the second display area but are not disposed in each of the first hole regions.

The pixel-defining layer may be a light-shielding insulating layer.

Second hole regions may be further defined between the first light-emitting diodes in the first display area, the pixel-defining layer may further include openings corresponding to the second hole regions, the light-shielding layer may not include openings corresponding to the second hole regions, and second circuit devices forming first pixel circuits and wires connected to the first pixel circuits may be disposed in the first display area but are not disposed in each of the second hole regions.

The pixel-defining layer may include first openings corresponding to the first light-emitting diodes, second openings corresponding to the second light-emitting diodes, and third openings corresponding to the first hole regions and the second hole regions, the light-shielding layer may include fourth openings overlapping the first openings, fifth openings overlapping the second openings, and sixth openings overlapping the third openings of the second display area, the color filters may be located at the fourth openings and the fifth openings, and the antireflection layer may further include an overcoated layer arranged on the light-shielding layer and the color filters, wherein at least a portion of the overcoated layer may be located at the sixth openings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
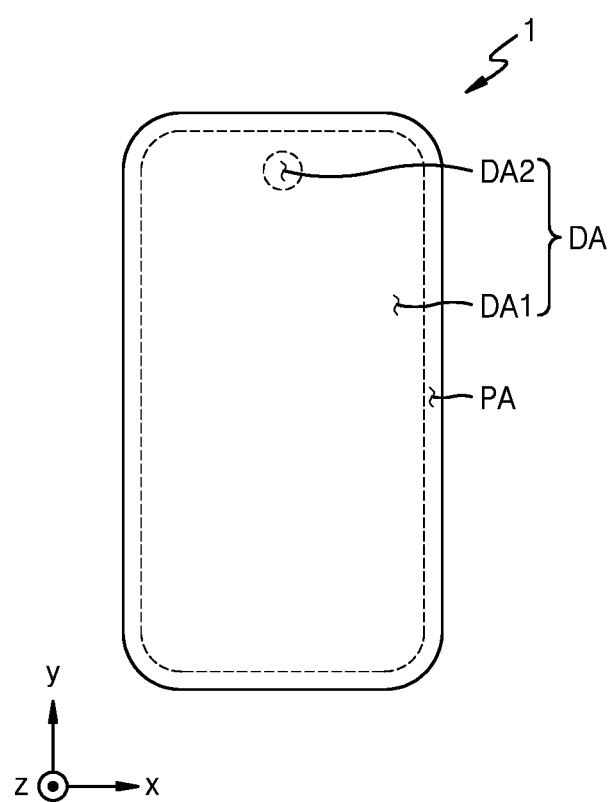
FIGS. 1 and 2 are plan views of a display apparatus according to embodiments of the inventive concepts.

In the following description, for the purposes of explanation, numerous specific details are set forth in order to provide a thorough understanding of various illustrative embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

As used herein, "on a plane" denotes that a target portion is viewed from above and "on a cross-section" means that a vertically cut cross-section of a target portion is viewed from a side. Furthermore, when a first element "overlaps" a second element, the first element may be located on or below the second element.

According to embodiments, an x-axis, a y-axis, and a z-axis are not limited to three axes on an orthogonal coordinate system, but may be interpreted in a broad sense including the three axes. For example, the x-axis, the y-axis, and the z-axis may be perpendicular to one another, or may represent different directions that are not perpendicular to one another.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
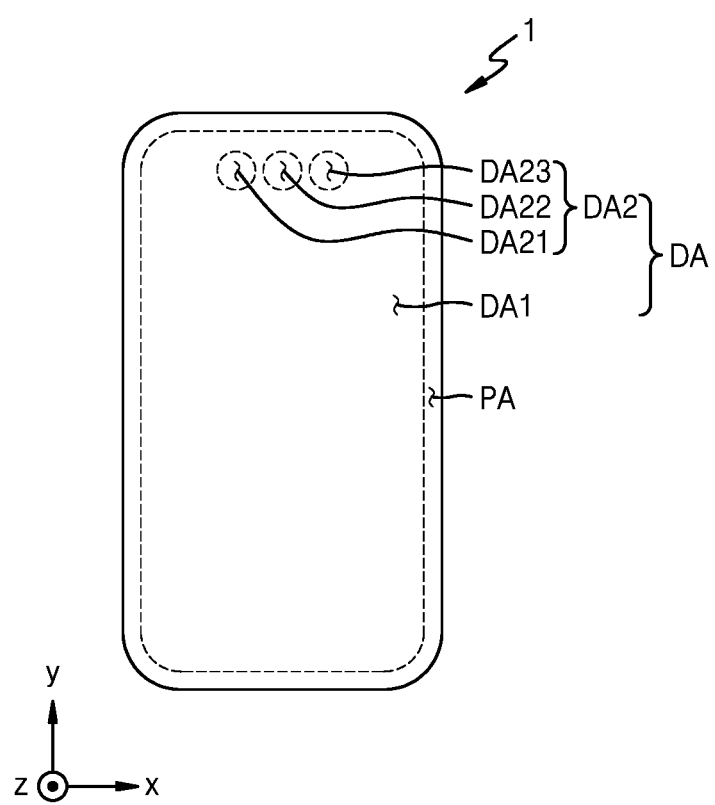

FIGS. 1 and 2 are plan views of a display apparatus 1 according to embodiments.

The display apparatus 1 according to an embodiment of the inventive concepts may be implemented as an electronic apparatus, such as a smartphone, a mobile phone, a navigation device, a game device, a TV, a head unit for a vehicle, a notebook computer, a laptop computer, a tablet computer, a personal media player (PMP), or a personal digital assistant (PDA). Also, the electronic apparatus may be a flexible apparatus.

The display apparatus 1 includes a display area DA and a peripheral area PA outside the display area DA. In a plan view of the display area DA, the display area DA may have a rectangular shape, as shown in FIG. 1. According to another embodiment, the display area DA may have a polygonal shape, such as a triangle, a pentagon, or a hexagon, or may have a circular shape, an oval shape, or an atypical shape. A corner of an edge of the display area DA may have a round shape. The peripheral area PA may be a non-display area where display elements are not arranged. The display area DA may be entirely surrounded by the peripheral area PA.

Pixels including various display elements, such as organic light-emitting diodes (OLEDs), may be arranged in the display area DA. There may be a plurality of pixels, and the plurality of pixels may produce an image by being arranged in various shapes, such as a stripe, a pentile, or a mosaic, in an x-axis direction and a y-axis direction.

The display area DA may include a first display area DA1 and a second display area DA2. At least a portion of the display area DA may be set as the second display area DA2. As shown in FIG. 1, only a portion of the display area DA may be set as the second display area DA2. According to another embodiment, the entire display area DA may be set as the second display area DA2.

As will be described below with reference to FIGS. 3A and 3B, the second display area DA2 may be an area where a component 40 is arranged below a display panel to correspond to the second display area DA2, and may correspond to a component area. The component 40 may be, without limitation, a camera, an illumination sensor, a proximity sensor, an iris sensor, or the like.

In FIG. 1, one second display area DA2 is located in the display area DA. According to another embodiment, as shown in FIG. 2, the display apparatus 1 may include two or more second display areas DA2, and shapes and sizes of the plurality of second display areas DA2 may be different from each other. The second display area DA2 may have any one of various shapes, such as a circular shape, an oval shape, a polygonal shape such as a rectangle, a star shape, and a diamond shape, when viewed in a direction approximately perpendicular to an upper surface of the display apparatus 1. Components 40 corresponding to the plurality of second display areas DA2 and having different functions, respectively, may be arranged. According to an embodiment, a camera may be arranged in a 1st second display area DA21, an illumination sensor may be arranged in a 2nd second display area DA22, and a proximity sensor may be arranged in a 3rd second display area DA23.

Figure 3A:
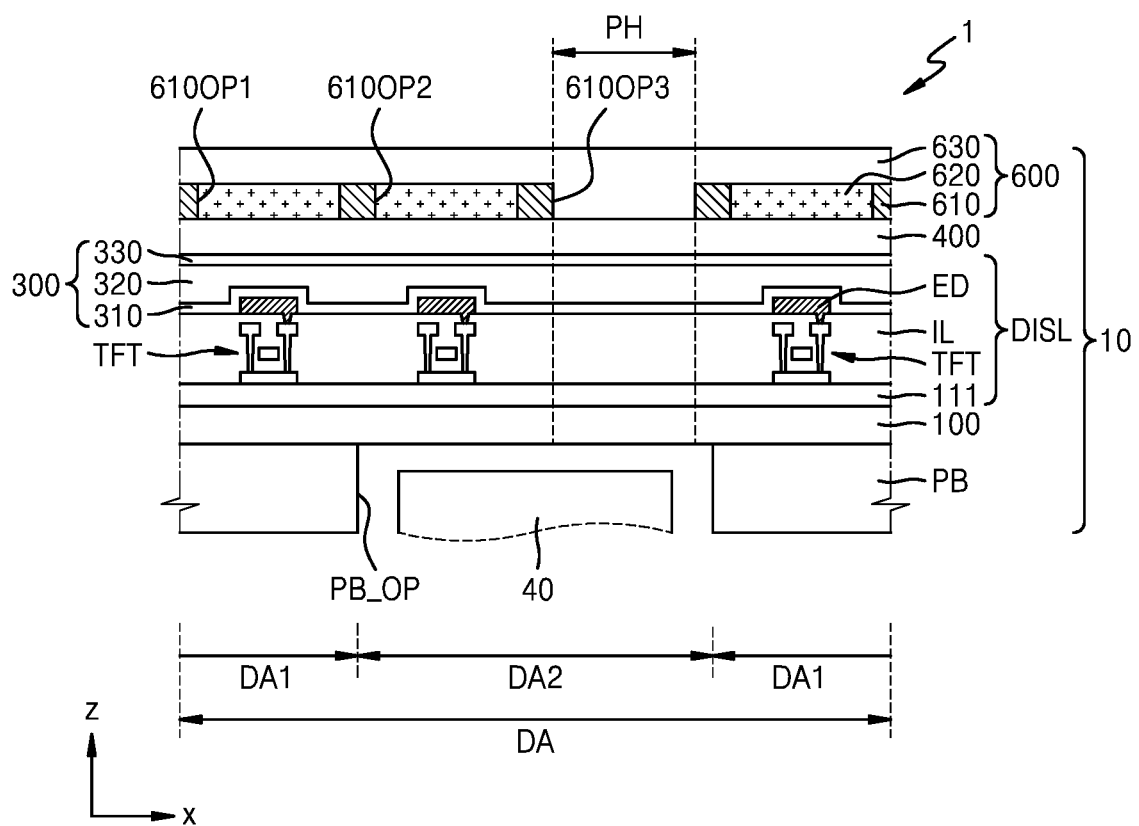
FIGS. 3A and 3B are cross-sectional views of a portion of a cross-section of a display apparatus, according to embodiments.
Figure 3B:
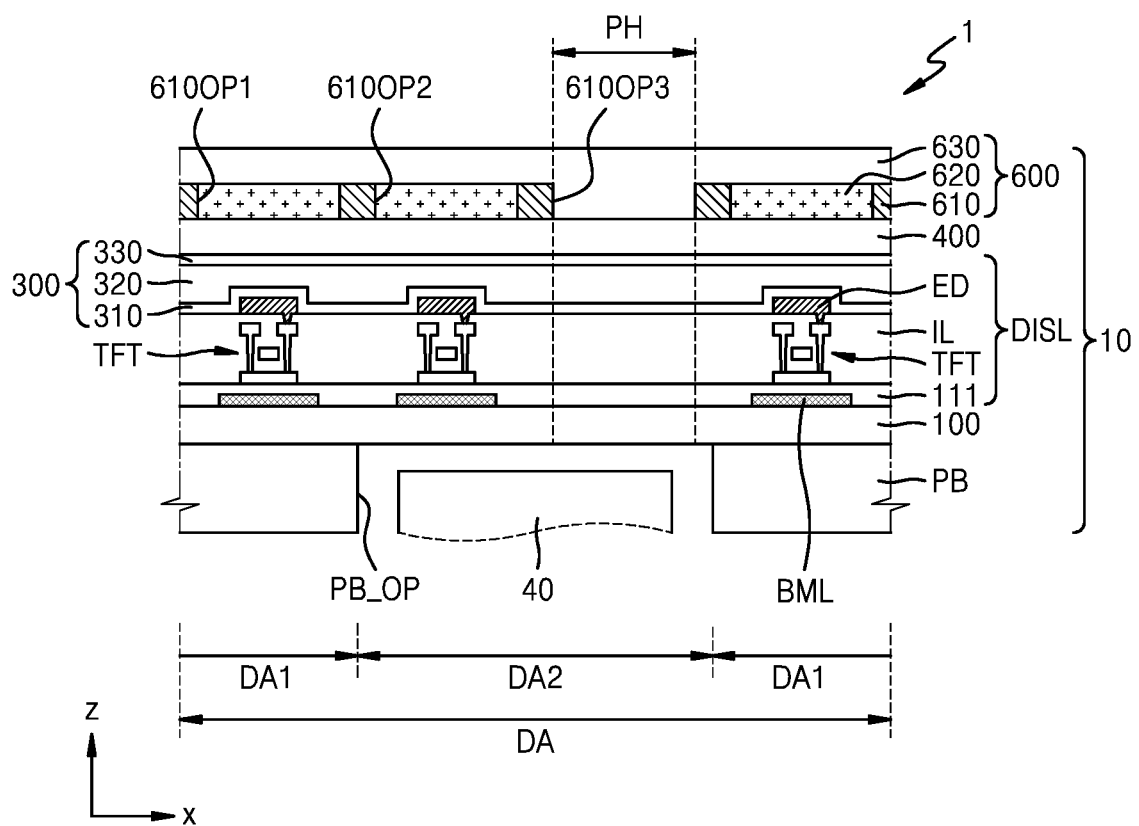

FIGS. 3A and 3B are cross-sectional views of a portion of a cross-section of the display apparatus 1, according to embodiments.

Referring to FIG. 3A, the display apparatus 1 may include a display panel 10 and the component 40 overlapping the display panel 10.

The display panel 10 includes the display area DA, and the display area DA may include the first display area DA1 occupying most of the display area DA and the second display area DA2 having a relatively small area compared to the first display area DA1.

The display panel 10 may include a substrate 100, a display layer DISL on the substrate 100, a touch-screen layer 400, an antireflection layer 600, and a lower protection film PB arranged below the substrate 100. A window protecting the display panel 10 may be further arranged on an upper portion of the display panel 10.

The substrate 100 may include glass or a polymer resin. The substrate 100 including the polymer resin may be flexible, foldable, rollable, or bendable. The substrate 100 may have a multi-layer structure including a layer including the polymer resin and an inorganic layer.

The display layer DISL may include a pixel circuit including a thin-film transistor TFT, a light-emitting element ED that is a display element, and a thin-film encapsulation layer 300. The light-emitting element ED may be electrically connected to the thin-film transistor TFT arranged therebelow. In this regard, FIG. 3A illustrates a buffer layer 111 arranged on the substrate 100 and the thin-film transistor TFT arranged on the buffer layer 111. The thin-film transistor TFT and the light-emitting element ED electrically connected to the thin-film transistor TFT may be respectively arranged in the first display area DA1 and the second display area DA2.

A plurality of hole regions PH, where the display element and a wire (a conductive line) configuring the pixel circuit are not arranged, may be in the second display area DA2. The hole region PH may be an area through which light/signals emitted from the component 40 arranged corresponding to the second display area DA2 or light/signals incident on the component 40 is transmitted.

As shown in FIG. 3B, a blocking metal layer BML may be further arranged in the second display area DA2. The blocking metal layer BML may be arranged between the substrate 100 and the buffer layer 111 so as to prevent a function of the thin-film transistor TFT arranged in the second display area DA2 from deteriorating by light passing through the second display area DA2. The blocking metal layer BML may also be arranged in the first display area DA1. The blocking metal layer BML arranged in the second display area DA2 may include an opening overlapping the hole region PH.

The thin-film encapsulation layer 300 may include at least one inorganic encapsulation layer and at least one organic encapsulation layer. According to an embodiment, the thin-film encapsulation layer 300 may include first and second inorganic encapsulation layers 310 and 330, and an organic encapsulation layer 320 therebetween.

The touch-screen layer 400 may be arranged on the thin-film encapsulation layer 300. The touch-screen layer 400 may obtain coordinate information according to an external input, for example, a touch event of an object, such as a finger or a stylus pen. The touch-screen layer 400 may include a touch electrode and wires connected to the touch electrode. The touch-screen layer 400 may detect the external input via a magnetic capacitance method or a mutual capacitance method.

The antireflection layer 600 may reduce the reflectance of light (external light) incident from the outside towards the display apparatus 1. The antireflection layer 600 may include a light-shielding layer 610, color filters 620, and an overcoated layer 630. The light-shielding layer 610 may include an opening 6100P1 overlapping the light-emitting element ED of the first display area DA1 and an opening 6100P2 overlapping the light-emitting element ED of the second display area DA2, and the color filters 620 may be respectively arranged in the openings 610OP1 and 610OP2. The light-shielding layer 610 may include openings 610OP3 not overlapping the light-emitting element ED. The opening 610OP3 corresponds to the hole region PH and a portion of the overcoated layer 630 may be located in the opening 610OP3. In other words, the color filter 620 and the light-shielding layer 610 are not present in a region of the antireflection layer 600 corresponding to the hole region PH.

The color filter 620 may be arranged considering a color of light emitted from each pixel of the display panel 10. For example, the color filter 620 may include a color of red, green, or blue depending on a color of light emitted from the light-emitting element ED. The overcoated layer 630 may include an organic material such as resin, and the organic material may be transparent.

The display apparatus 1 including the color filter 620 and the light-shielding layer 610 of the antireflection layer 600 may have a largely reduced thickness compared to a display apparatus including a polarizing plate.

A window may be arranged on an upper portion of the display panel 10, for example, on the antireflection layer 600, to protect the display panel 10. The window may be combined with the antireflection layer 600 via an adhesive layer, such as an optically clear adhesive. The window may include a glass material or a plastic material. The glass material may include ultra-thin glass. The plastic material may include polyether sulfone, polyacrylate, polyether imide, polyethylene naphthalate, polyethylene terephthalate, polyphenylene sulfide, polyarylate, polyimide, polycarbonate, or cellulose acetate propionate.

The lower protection film PB may be attached to a lower surface of the substrate 100 to support and protect the substrate 100. The lower protection film PB may include an opening PB_OP corresponding to the second display area DA2. The lower protection film PB includes the opening PB_OP, thereby enhancing the light transmittance of the second display area DA2. The lower protection film PB may include polyethylene terephthalate (PET) or polyimide (PI).

An area of the second display area DA2 may be greater than an area where the component 40 is arranged. Accordingly, an area of the opening PB_OP in the lower protection film PB may not match the area of the second display area DA2.

Figure 4:
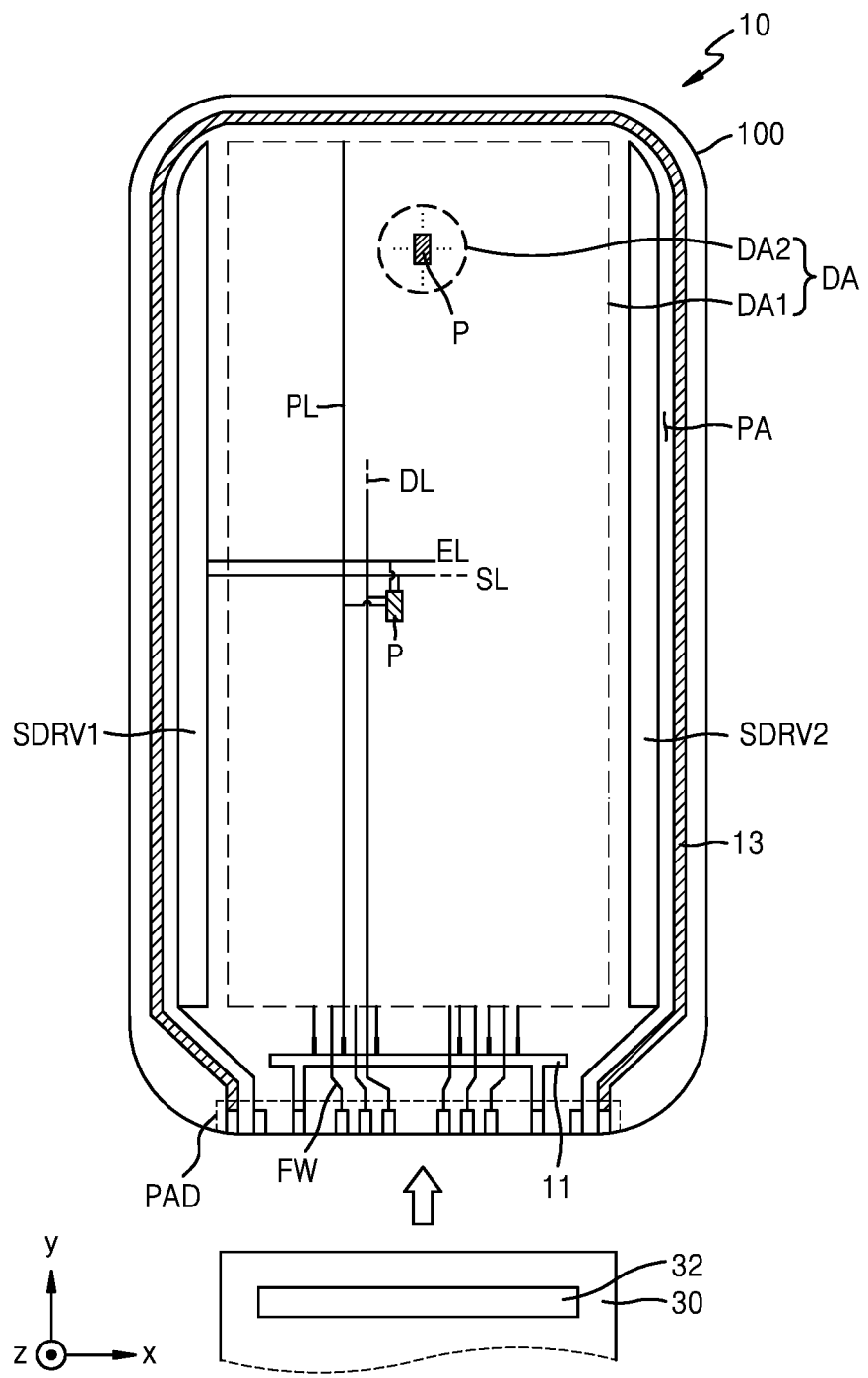
FIG. 4 is a plan view of a display panel according to an embodiment.

FIG. 4 is a plan view of the display panel 10 according to an embodiment.

Referring to FIG. 4, various components forming the display panel 10 are arranged on the substrate 100. The substrate 100 includes the display area DA and the peripheral area PA surrounding the display area DA. The display area DA includes the first display area DA1 and the second display area DA2.

The plurality of pixels P are arranged in the first display area DA1 and the second display area DA2. The pixels P may each be implemented as a display element, such as an organic light-emitting diode OLED. Each pixel P may emit, for example, red, green, or white light. According to an embodiment of the inventive concepts, a resolution of the second display area DA2 may be the same as a resolution of the first display area DA1.

Each of pixel circuits driving the pixels P may be electrically connected to outer circuits arranged in the peripheral area PA. A first scan driving circuit SDRV1, a second scan driving circuit SDRV2, a terminal portion PAD, a driving voltage supply line 11, and a common voltage supply line 13 may be arranged in the peripheral area PA.

The first scan driving circuit SDRV1 may apply a scan signal to each of the pixel circuits driving the pixels P, via a first scan line SL. The first scan driving circuit SDRV1 may apply an emission control signal to each pixel circuit via an emission control line EL. The second scan driving circuit SDRV2 may be located on an opposite side of the first scan driving circuit SDRV1, based on the display area DA, and may be approximately parallel to the first scan driving circuit SDRV1. Some of pixel circuits of the pixels P of the display area DA may be electrically connected to the first scan driving circuit SDRV1 and the remaining pixel circuits may be electrically connected to the second scan driving circuit SDRV2. The second scan driving circuit SDRV2 may be omitted.

The terminal portion PAD may be arranged at one side of the substrate 100. The terminal portion PAD may not be covered by an insulating layer and be exposed to be connected to a display circuit board 30. A display driving unit 32 may be arranged in the display circuit board 30.

The display driving unit 32 may be configured to generate a control signal transmitted to the first scan driving circuit SDRV1 and the second scan driving circuit SDRV2. The display driving unit 32 may be configured to generate a data signal, and the generated data signal may be transmitted to the pixel circuits of the pixels P via a fan-out line FW and a data line DL connected to the fan-out line FW.

The display driving unit 32 may be configured to supply a driving voltage ELVDD to the driving voltage supply line 11 and supply a common voltage ELVSS to the common voltage supply line 13. The driving voltage ELVDD may be applied to pixel circuits of the pixels P via a driving voltage line PL connected to the driving voltage supply line 11, and the common voltage ELVSS may be applied to an opposing electrode of the display element via the common voltage supply line 13.

The driving voltage supply line 11 may be connected to the terminal portion PAD and may extend below the display area DA in the x-axis direction. The common voltage supply line 13 may be connected to the terminal portion PAD and may partially surround the display area DA by having a loop shape in which one side is open.

Figure 5A:
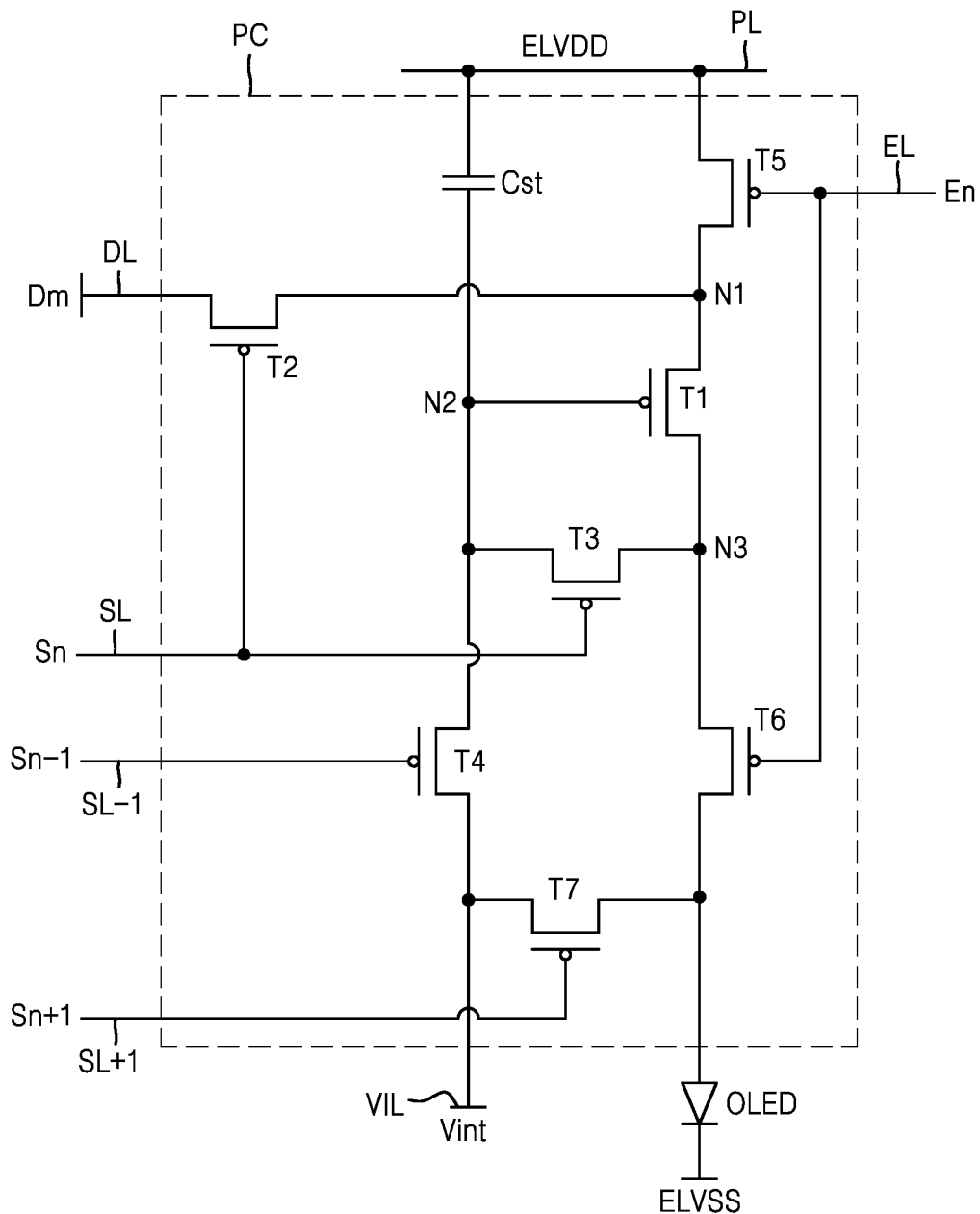
FIGS. 5A and 5B are each an equivalent circuit diagram of a pixel circuit driving a pixel, according to embodiments.
Figure 5B:
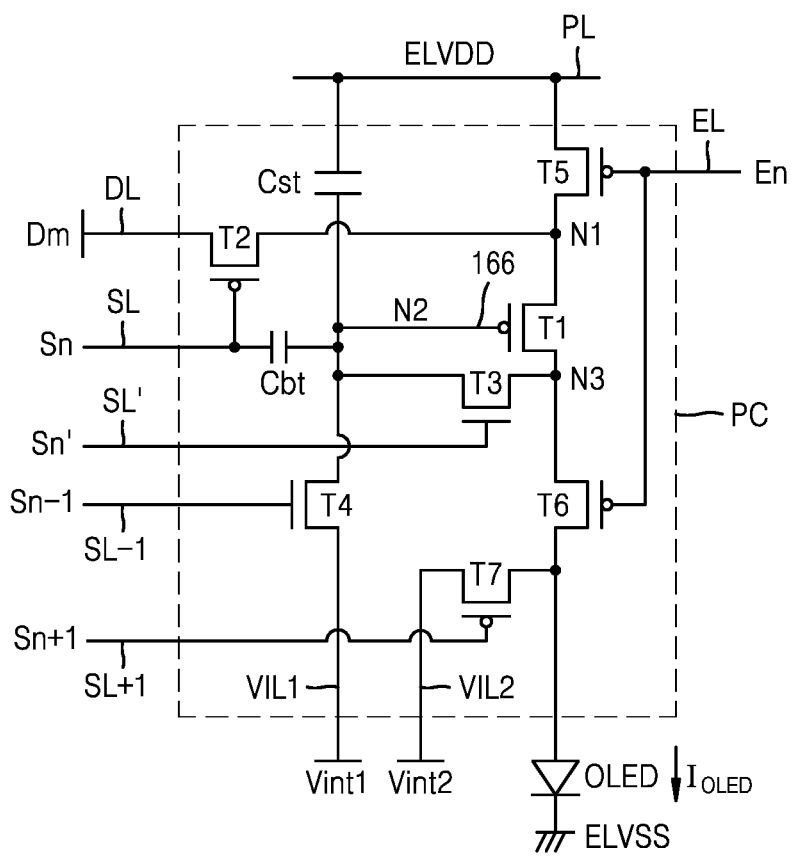

FIGS. 5A and 5B are each an equivalent circuit diagram of a pixel circuit PC driving a pixel, according to embodiments.

Referring to FIG. 5A, the pixel circuit PC may implement emission of the pixel by being connected to a light-emitting element that is a display element. The light-emitting element may be an organic light-emitting diode OLED. The pixel circuit PC includes first through seventh transistors T1 through T7, and according to a type (p-type or n-type) of a transistor and/or an operation condition, a first terminal of each of the first through seventh transistors T1 through T7 may be a source terminal or a drain terminal, and a second terminal thereof may be a terminal different from the first terminal. For example, when the first terminal is a source terminal, the second terminal may be a drain terminal.

The pixel circuit PC may be connected to the first scan line SL configured to transmit a first scan signal Sn, a second scan line SL−1 configured to transmit a second scan signal Sn−1, a third scan line SL+1 configured to transmit a third scan signal Sn+1, the emission control line EL configured to transmit an emission control signal En, the data line DL configured to transmit a data signal Dm, the driving voltage line PL configured to transmit the driving voltage ELVDD, and an initialization voltage line VIL configured to transmit an initialization voltage Vint.

The first transistor T1 may be connected between the driving voltage line PL and the organic light-emitting diode OLED. The first transistor T1 may be connected to the driving voltage line PL via the fifth transistor T5, and electrically connected to the organic light-emitting diode OLED via the sixth transistor T6. The first transistor T1 includes a gate terminal connected to a second node N2, a first terminal connected to a first node N1, and a second terminal connected to a third node N3. The first transistor T1 operates as a driving transistor and supplies a driving current to a light-emitting element by receiving a data signal Dm according to a switching operation of the second transistor T2.

The second transistor T2 (switching transistor) may be connected between the data line DL and the first node N1 and connected to the driving voltage line PL via the fifth transistor T5. The first node N1 may be a node to which the first transistor T1 and the fifth transistor T5 are connected. The second transistor T2 may include a gate terminal connected to the first scan line SL, a first terminal connected to the data line DL, and a second terminal connected to the first node N1 (or the first terminal of the first transistor T1). The second transistor T2 may be turned on according to the first scan signal Sn received via the first scan line SL to perform a switching operation of transmitting the data signal Dm transmitted to the data line DL, to the first node N1.

The third transistor T3 (compensation transistor) may be connected between the second node N2 and the third node N3. The third transistor T3 may be connected to the organic light-emitting diode OLED via the sixth transistor T6. The second node N2 may be a node to which a gate electrode of the first transistor T1 is connected, and the third node N3 may be a node to which the first transistor T1 and the sixth transistor T6 are connected. The third transistor T3 includes a gate terminal connected to the first scan line SL, a first terminal connected to the second node N2 (or the gate terminal of the first transistor T1), and a second terminal connected to the third node N3 (or the second terminal of the first transistor T1). The third transistor T3 is turned on according to the first scan signal Sn received via the first scan line SL to compensate for a threshold voltage of the first transistor T1 by diode-connecting the first transistor T1. The third transistor T3 may have a structure in which two or more transistors are connected in series.

The fourth transistor T4 (first initialization transistor) may be connected between the second node N2 and the initialization voltage line VIL. The fourth transistor T4 includes a gate terminal connected to the second scan line SL−1, a first terminal connected to the second node N2, and a second terminal connected to the initialization voltage line VIL. The fourth transistor T4 may be turned on according to the second scan signal Sn−1 received via the second scan line SL−1 to initialize a gate voltage of the first transistor T1 by transmitting the initialization voltage Vint to the gate terminal of the first transistor T1. The fourth transistor T4 may have a structure in which two or more transistors are connected in series.

The fifth transistor T5 (first emission control transistor) may be connected between the driving voltage line PL and the first node N1. The sixth transistor T6 (second emission control transistor) may be connected between the third node N3 and the organic light-emitting diode OLED. The fifth transistor T5 includes a gate terminal connected to the emission control line EL, a first terminal connected to the driving voltage line PL, and a second terminal connected to the first node N1. The sixth transistor T6 includes a gate terminal connected to the emission control line EL, a first terminal connected to the third node N3, and a second terminal connected to a pixel electrode of the organic light-emitting diode OLED. The fifth transistor T5 and the sixth transistor T6 may be simultaneously turned on according to the emission control signal En received via the emission control line EL, and thus, a current flows through the organic light-emitting diode OLED.

The seventh transistor T7 (second initialization transistor) may be connected between the organic light-emitting diode OLED and the initialization voltage line VIL. The seventh transistor T7 includes a gate terminal connected to the third scan line SL+1, a first terminal connected to the second terminal of the sixth transistor T6 and the pixel electrode of the organic light-emitting diode OLED, and a second terminal connected to the initialization voltage line VIL. The seventh transistor T7 may be turned on according to the third scan signal Sn+1 received via the third scan line SL+1 to initialize a voltage of the pixel electrode of the organic light-emitting diode OLED by transmitting the initialization voltage Vint to the pixel electrode of the organic light-emitting diode OLED. The seventh transistor T7 may be omitted.

A capacitor Cst may include a first electrode connected to the second node N2 and a second electrode connected to the driving voltage line PL. The capacitor Cst may maintain a voltage applied to the gate electrode of the first transistor T1 by storing and maintaining a voltage corresponding to a difference between voltages supplied to both ends of the first electrode and the second electrode, respectively.

The organic light-emitting diode OLED may include the pixel electrode and the opposing electrode facing the pixel electrode, and the opposing electrode may receive the common voltage ELVSS. The organic light-emitting diode OLED may display an image by emitting light of a certain color by receiving a driving current corresponding to a value of the voltage stored in the capacitor Cst from the first transistor T1. The opposing electrode may be commonly provided, i.e., may be integrated to the plurality of pixels P.

In FIG. 5A, transistors of the pixel circuit PC are P-type transistors, but an embodiment of the inventive concepts is not limited thereto. For example, various embodiments are possible, such as the transistors of the pixel circuit PC may be N-type transistors, or some of the transistors may be P-type transistors and the remaining transistors may be N-type transistors.

Referring to FIG. 5B, the third transistor T3 and the fourth transistor T4 among the first through seventh transistors Ti through T7 of the pixel circuit PC may be implemented as n-channel MOSFETs (NMOSs) and the remaining ones may be implemented as p-channel MOSFETs (PMOSs). Hereinafter, configurations different from FIG. 5A will be mainly described.

The third transistor T3 includes the gate terminal connected to a fourth scan line SL', the first terminal connected to the second node N2, and the second terminal connected to the third node N3. The third transistor T3 is turned on according to a scan signal Sn' received via the fourth scan line SL' to compensate for the threshold voltage of the first transistor T1 by diode-connecting the first transistor T1.

The fourth transistor T4 includes the gate terminal connected to the second scan line SL−1, the first terminal connected to the second node N2, and the second terminal connected to a first initialization voltage line VIL1. The fourth transistor T4 may be turned on according to the second scan signal Sn−1 received via the second scan line SL−1 to initialize the gate voltage of the first transistor T1 by transmitting a first initialization voltage Vint1 to the gate terminal of the first transistor T1.

The seventh transistor T7 includes the gate terminal connected to the third scan line SL+1, the first terminal connected to the second terminal of the sixth transistor T6 and the pixel electrode of the organic light-emitting diode OLED, and the second terminal connected to a second initialization voltage line VIL2. The seventh transistor T7 may be turned on according to the third scan signal Sn+1 received via the third scan line SL+1 to initialize the voltage of the pixel electrode of the organic light-emitting diode OLED by transmitting a second initialization voltage Vint2 to the pixel electrode of the organic light-emitting diode OLED. The seventh transistor T7 may be omitted.

According to another embodiment, the fourth transistor T4 and the seventh transistor T7 may receive a same initialization voltage by being connected to a same initialization voltage line.

The pixel circuit PC may include a boosting capacitor Cbt. The boosting capacitor Cbt may include a third electrode connected to the first scan line SL and the gate electrode of the second transistor T2, and a fourth electrode connected to the gate electrode of the first transistor T1 and the first electrode of the capacitor Cst. When the first scan signal Sn of the first scan line SL is a voltage that turns off the second transistor T2, the boosting capacitor Cbt may increase a voltage of the second node N2 to reduce a voltage (black voltage) displaying black.

Figure 6:
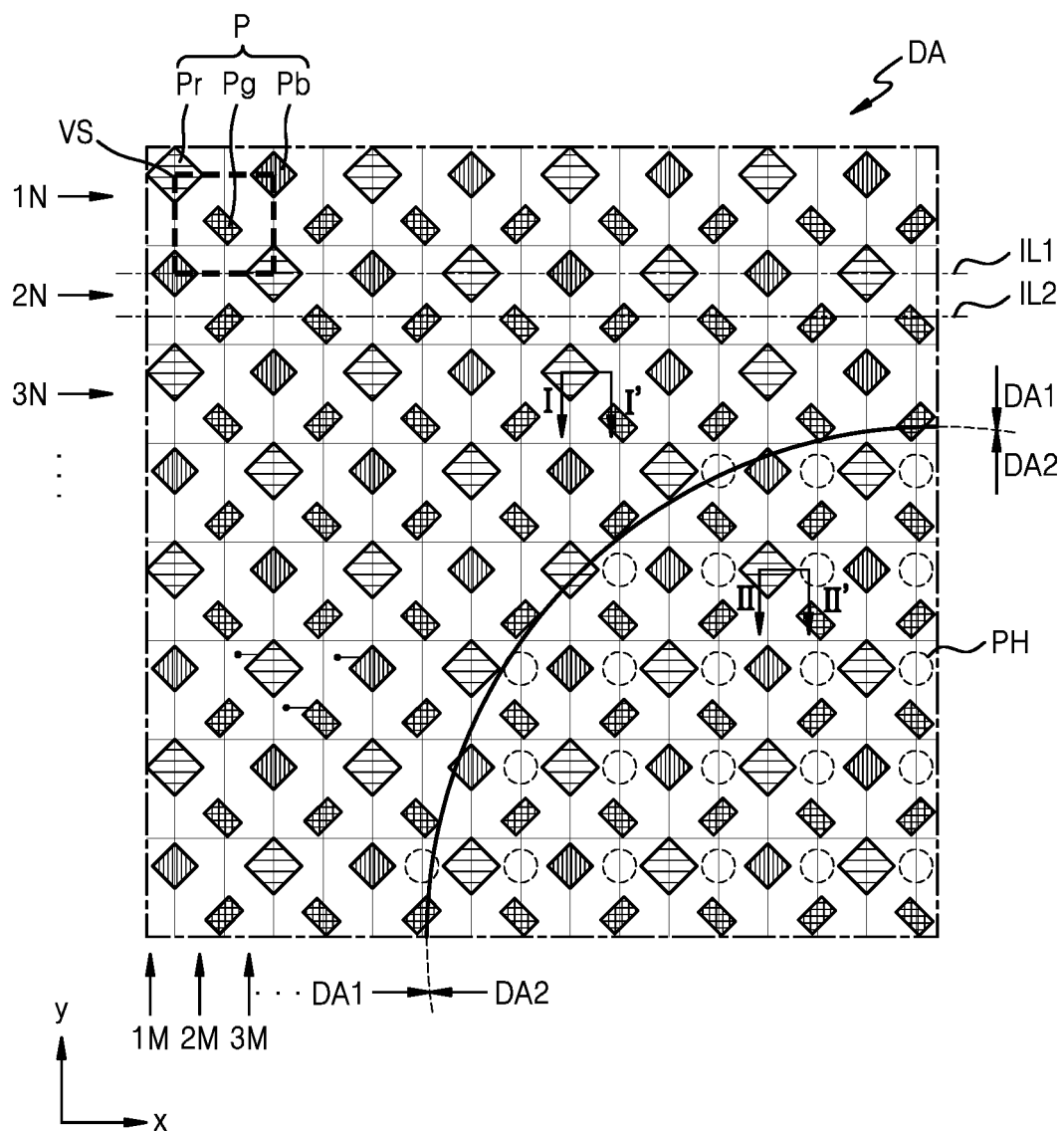
FIG. 6 is a plan view of a portion of a display area of a display apparatus, according to an embodiment.

FIG. 6 is a plan view of a portion of the display area DA of a display apparatus, according to an embodiment.

Referring to FIG. 6, the pixels P are arranged in the first display area DA1 and the second display area DA2, and may include first through third pixels emitting different colors of light. Hereinafter, for convenience of description, it is described that the first pixel is a red pixel Pr, the second pixel is a green pixel Pg, and the third pixel is a blue pixel Pb.

The red pixel Pr, the green pixel Pg, and the blue pixel Pb may be arranged in the first display area DA1 and the second display area DA2 according to a certain rule. In FIG. 6, regions of the display area DA defined by solid lines are pixel circuit regions where the pixel circuit connected to the pixel P is arranged.

The red pixel Pr, the green pixel Pg, and the blue pixel Pb may be alternately spaced apart from each other in each row N. In each row N, the red pixel Pr and the blue pixel Pb may be alternately spaced apart from each other along a first virtual line IL1 and the green pixels Pg may be spaced apart from each other along a second virtual line IL2. Such arrangements of pixels may be repeated until a last row. Here, sizes (or widths) of the blue pixel Pb and red pixel Pr may be greater than a size (or a width) of the green pixel Pg.

The red pixel Pr and blue pixel Pb arranged along the first virtual line ILL and the green pixel Pg arranged along the second virtual line IL2 may be misaligned. Accordingly, the red pixel Pr and the blue pixel Pb may be alternately arranged in a first column 1M, the green pixels Pg may be spaced apart from each other at a certain interval in an adjacent second column M, the blue pixel Pb and the red pixel Pr may be alternately arranged in an adjacent third column 3M, and the green pixels Pg may be spaced apart from each other at a certain interval in an adjacent fourth column 4M. Such an arrangement of pixels may be repeated until a last column.

In other words, the red pixels Pr are arranged on first and third vertexes of a virtual quadrangle VS, which face each other, and the green pixels Pg are arranged on second and fourth vertexes which are remaining vertexes, wherein a center of the virtual quadrangle VS is a center of the green pixel Pg. Here, the virtual quadrangle VS may be variously modified to a rectangle, a rhombus, or a square.

Such an arrangement of pixels is referred to as a Pen-Tile™ structure, and high resolution may be realized with a less number of pixels by applying rendering driving of representing colors by sharing adjacent pixels.

In the present specification, a pixel denotes an emission area realizing an image in a minimum unit. When an organic light-emitting diode is employed as a display element, the emission area of the pixel may be defined by an opening of an emission layer or a pixel-defining layer.

The red pixel Pr, the green pixel Pg, and the blue pixel Pb shown in FIG. 6 may emit red, green, and blue light, respectively, by using a light-emitting diode. Accordingly, the arrangement of pixels may correspond to an arrangement of light-emitting diodes that are display elements. For example, a location of the red pixel Pr shown in FIG. 6 may indicate a location of a light-emitting diode emitting red light. Similarly, a location of the green pixel Pg may indicate a location of a light-emitting diode emitting green light, and a location of the blue pixel Pb may indicate a location of a light-emitting diode emitting blue light.

The first display area DA1 and the second display area DA2 may have a same arrangement of pixels. The first display area DA1 and the second display area DA2 may have a same resolution. A structure of the pixel circuit to which the light-emitting diode of the pixel P arranged in the first display area DA1 is connected may be the same as a structure of the pixel circuit to which the light-emitting diode of the pixel P arranged in the second display area DA2 is connected.

The plurality of hole regions PH may be located in the second display area DA2 with regularity at regular intervals. The hole region PH is located between a pair of adjacent pixels P, i.e., between the light-emitting diodes, and may not overlap the light-emitting diode. In an embodiment, the hole region PH may be located on a boundary of a pair of adjacent pixel circuit regions. The pixel circuit or a pixel element and/or wires configuring the pixel circuit may not be arranged in the hole region PH. Accordingly, an area (size) occupied by the pixel circuit arranged in the second display area DA2 may be less than an area (size) occupied by the pixel circuit arranged in the first display area DA1.

The hole region PH does not denote an actual hole formed in a substrate or an insulating layer, but may be defined by a region having a certain area and seen in a hole-like shape, as a circuit device forming the pixel circuit and/or wires (signal lines) connected to the pixel circuit are not arranged on this region of the substrate 100, when viewed in a direction perpendicular to the upper surface of the substrate 100, according to the arrangement of the circuit device and wires on the substrate 100.

Each of the pixels P may be arranged on an upper layer of the corresponding pixel circuit. The pixel P may be arranged on an upper portion immediately to overlap the pixel circuit, or may be offset from the pixel circuit and arranged to at least partially overlap the pixel circuit of the other pixel P arranged on an adjacent row or column. In other words, the pixels P may be arranged in a corresponding pixel circuit region or some of the pixels P may be arranged in another pixel circuit region adjacent to the corresponding pixel circuit region. FIG. 6 illustrates an example in which each pixel P is connected to a left pixel circuit.

In FIG. 6, the hole region PH is circular, but an embodiment of the inventive concepts is not limited thereto. For example, a shape of the hole region PH may be oval, triangular, or polygonal such as pentagonal. A location and size of the hole region PH may also be variously changed according to a structure and arrangement of pixel circuits. Also, in FIG. 6, one hole region PH is located between a pair of adjacent pixels P, but the plurality of hole regions PH may be located between the pair of adjacent pixels P depending on the structure and arrangement of pixel circuits.

Figure 7:
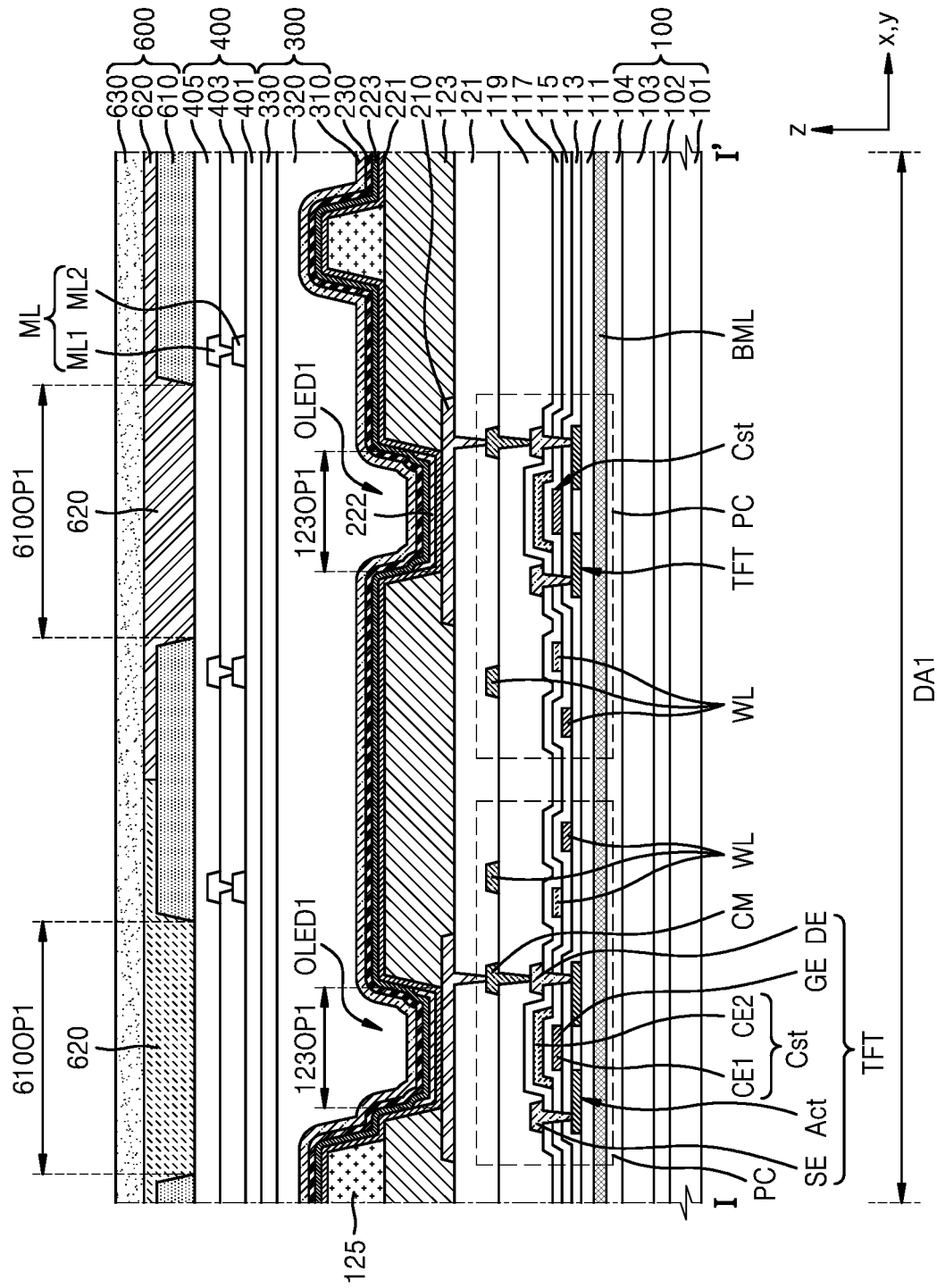
FIG. 7 is a cross-sectional view of the display apparatus taken along a line I-I' of FIG. 6.
Figure 8:
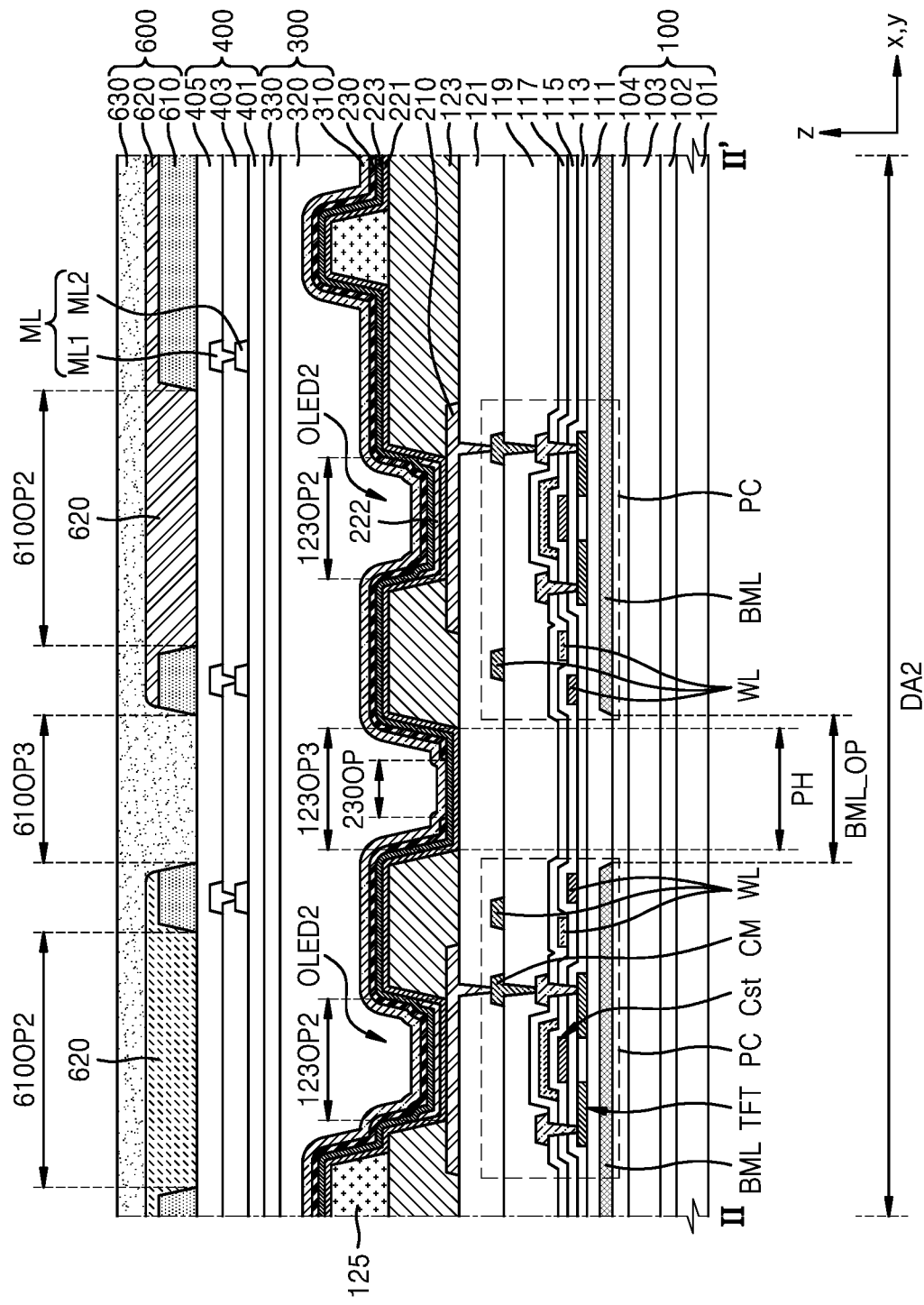
FIG. 8 is a cross-sectional view of the display apparatus taken along a line II-IF of FIG. 6.

FIG. 7 is a cross-sectional view of the display apparatus taken along a line I-I' of FIG. 6. FIG. 8 is a cross-sectional view of the display apparatus taken along a line of FIG. 6.

FIGS. 7 and 8 illustrate a case where a light-emitting element that is a display element of a display panel includes an organic light-emitting diode. An organic light-emitting diode may be arranged in each of the first and second display areas DA1 and DA2, and for convenience of description, the organic light-emitting diode arranged in the first display area DA1 is referred to as a first organic light-emitting diode OLED1 and the organic light-emitting diode arranged in the second display area DA2 is referred to as a second organic light-emitting diode OLED2.

Referring to FIGS. 7 and 8, the first organic light-emitting diode OLED1 and the second organic light-emitting diode OLED2 may be formed on the substrate 100.

The substrate 100 may include a first base layer 101, a first barrier layer 102, a second base layer 103, and a second barrier layer 104. The first base layer 101 and the second base layer 103 may include polymer resin, and the first barrier layer 102 and the second barrier layer 104 may include an inorganic insulating material. The polymer resin may include polyether sulfone, polyacrylate, polyether imide, polyethylene naphthalate, polyethylene terephthalate, polyphenylene sulfide, polyarylate, polyimide, polycarbonate, and/or cellulose acetate propionate.

The buffer layer 111 may be arranged on the substrate 100. The buffer layer 111 may reduce or prevent penetration of a foreign material, moisture, or external air from a lower portion of the substrate 100. The buffer layer 111 may include an inorganic insulating material, such as silicon oxide, silicon oxynitride, or silicon nitride, and may have a single layer or multi-layer structure including such a material.

The blocking metal layer BML may be provided between the substrate 100 and the buffer layer 111, and located in the first display area DA1 and the second display area DA2. The blocking metal layer BML may include a metal having conductivity, such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The blocking metal layer BML may be provided to correspond to a portion of the pixel circuit PC. For example, the blocking metal layer BML has a structure in which regions corresponding to at least a driving transistor are connected to each other, and may include openings corresponding to remaining circuit devices. According to another embodiment, the blocking metal layer BML may be provided only in the second display area DA2 or may not be provided in both the first display area DA1 and second display area DA2.

The first organic light-emitting diode OLED1 and the second organic light-emitting diode OLED2 may each be electrically connected to the pixel circuit PC. The first organic light-emitting diode OLED1 may be electrically connected to the pixel circuit PC between the substrate 100 and the first organic light-emitting diode OLED1, and the second organic light-emitting diode OLED2 may be electrically connected to the pixel circuit PC between the substrate 100 and the second organic light-emitting diode OLED2.

The pixel circuit PC may include the thin-film transistor TFT, the capacitor Cst, and a plurality of wires WL connected thereto. The thin-film transistor TFT may include a semiconductor layer Act, a gate electrode GE overlapping a channel region of the semiconductor layer Act, and a source electrode SE and drain electrode DE respectively connected to a source region and drain region of the semiconductor layer Act. A first gate insulating layer 113 may be provided between the semiconductor layer Act and the gate electrode GE, and a second gate insulating layer 115 and first interlayer insulating layer 117 may be provided between the gate electrode GE and the drain electrode DE, and between the gate electrode GE and the source electrode SE. A second interlayer insulating layer 119 may be provided on the source electrode SE and drain electrode DE.

The semiconductor layer Act may include polysilicon. According to an embodiment, the semiconductor layer Act may include amorphous silicon. According to an embodiment, the semiconductor layer Act may include an oxide semiconductor of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer Act may include the channel region, and the source region and the drain region doped with impurities.

The capacitor Cst may overlap the thin-film transistor TFT. The capacitor Cst may include a lower electrode CE1 and an upper electrode CE2 that overlap each other. According to an embodiment, the gate electrode GE of the thin-film transistor TFT may include the lower electrode CE1 of the capacitor Cst.

The gate electrode GE or the lower electrode CE1 may include a low-resistance conductive material such as molybdenum (Mo), aluminum (Al), copper (Cu), and/or titanium (Ti), and may have a single layer or multi-layer structure including such a material.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or multi-layer structure including such a material. The second gate insulating layer 115 may be provided between the lower electrode CE1 and the upper electrode CE2.

The source electrode SE and/or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or multi-layer structure including such a material. For example, the source electrode SE and/or the drain electrode DE may have a three-layer structure of titanium layer/aluminum layer/titanium layer.

The first gate insulating layer 113, the second gate insulating layer 115, the first interlayer insulating layer 117, and the second interlayer insulating layer 119 may each include an inorganic insulating material, such as silicon oxide, silicon oxynitride, or silicon nitride, and may have a single layer or multi-layer structure including such a material.

A planarization layer 121 may be provided on the second interlayer insulating layer 119. The planarization layer 121 may include an organic material such as acryl, benzocyclobutene (BCB), polyimide, or hexamethyldisiloxane (HMDSO). Alternatively, the planarization layer 121 may include an inorganic material. The planarization layer 121 functions as a protection film covering the first through seventh transistors T1 through T7, and an upper portion of the planarization layer 121 is provided to be flat. The planarization layer 121 may be provided in a single layer or a multi-layer.

The plurality of wires WL may be provided between the first gate insulating layer 113, the second gate insulating layer 115, the first interlayer insulating layer 117, the second interlayer insulating layer 119, and the planarization layer 121. The plurality of wires WL may include a data line, a scan line, an emission control line, a driving voltage line, and an initialization voltage line, which are connected to the thin-film transistor TFT and the capacitor Cst.

A connection electrode CM may be arranged on a layer between the second interlayer insulating layer 119 and the planarization layer 121. The thin-film transistor TFT may be electrically connected to a first electrode 210 of a corresponding organic light-emitting diode through the connection electrode CM. The connection electrode CM may be connected to the thin-film transistor TFT via a contact hole of the second interlayer insulating layer 119, and the first electrode 210 may be connected to the connection electrode CM via a contact hole of the planarization layer 121.

The first organic light-emitting diode OLED1 and the second organic light-emitting diode OLED2 may each include an overlapping structure of the first electrode 210 that is a pixel electrode, an emission layer 222, and a second electrode 230 that is an opposing electrode. The overlapping structure may include a first functional layer 221 between the first electrode 210 and the emission layer 222 and/or a second functional layer 223 between the emission layer 222 and the second electrode 230.

The first electrode 210 may be arranged on the planarization layer 121. The first electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. The first electrode 210 may include the reflective layer including such a material and a transparent conductive layer on and/or below the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). According to an embodiment, the first electrode 210 may have a three-layer structure of ITO layer/Ag layer/ITO layer.

A pixel-defining layer 123 may cover an edge of the first electrode 210 and include an opening overlapping the first electrode 210. FIGS. 7 and 8 illustrate an opening (hereinafter, referred to as a first opening) 123OP1 overlapping the first electrode 210 of the first organic light-emitting diode OLED1, and an opening (hereinafter, referred to as a second opening) 123OP2 overlapping the first electrode 210 of the second organic light-emitting diode OLED2.

The first opening 123OP1 and the second opening 123OP2 of the pixel-defining layer 123 may respectively define emission areas of the first and second organic light-emitting diodes OLED1 and OLED2. For example, a width of the first opening 123)P1 of the pixel-defining layer 123 may correspond to a width of the emission area of the first organic light-emitting diode OLED1, and a width of the second opening 123OP2 of the pixel-defining layer 123 may correspond to a width of the emission area of the second organic light-emitting diode OLED2.

The pixel-defining layer 123 is a colored opaque light-shielding insulating layer and for example, may be black. For example, the pixel-defining layer 123 may include a polyimide (PI)-based binder and a pigment in which red, green, and blue are mixed. Alternatively, the pixel-defining layer 123 may include a cardo-based binder resin and a mixture of a lactam black pigment and a blue pigment. Alternatively, the pixel-defining layer 123 may include carbon black. The pixel-defining layer 123 may prevent reflection of an external light, together with the antireflection layer 600 described below, and may enhance contrast of the display panel.

A spacer 125 may be arranged on the pixel-defining layer 123. The spacer 125 may include a material different from that of the pixel-defining layer 123. The pixel-defining layer 123 and the spacer 125 may include different materials, for example, the pixel-defining layer 123 may include a negative photosensitive material, whereas the spacer 125 may include a positive photosensitive material, and may be formed via individual mask processes. The spacer 125 may be a transparent insulating layer.

The emission layer 222 may be located to correspond to each of the first opening 123OP1 and second opening 123OP2 of the pixel-defining layer 123, and may overlap the first electrode 210. The emission layer 222 may include a high-molecular weight organic material or low-molecular weight organic material, which emit light of certain color. The first functional layer 221 and the second functional layer 223 may be respectively arranged below and on the emission layer 222.

The first functional layer 221 may include a hole transport layer (HTL) and/or a hole injection layer (HIL). The second functional layer 223 may include an electron transport layer (ETL) and/or an electron injection layer (EIL). The first functional layer 221 and/or the second functional layer 223 may be entirely formed on the substrate 100, unlike the emission layer 222. In other words, the first functional layer 221 and/or the second functional layer 223 may cover the first display area DA1 and the second display area DA2.

The thin-film encapsulation layer 300 may cover the first and second organic light-emitting diodes OLED1 and OLED2. According to an embodiment, the thin-film encapsulation layer 300 may include a first inorganic encapsulation layer 310, a second inorganic encapsulation layer 330, and the organic encapsulation layer 320 therebetween.

The first and second inorganic encapsulation layers 310 and 330 may each include at least one inorganic insulating material. The inorganic insulating material may include aluminum oxide, titanium oxide, tantalum oxide, hafnium oxide, zinc oxide, silicon oxide, silicon nitride, and/or silicon oxynitride.

The organic encapsulation layer 320 may include a polymer-based material. Examples of the polymer-based material may include an acrylic resin, an epoxy resin, polyimide, and/or polyethylene. For example, the organic encapsulation layer 320 may include acrylic resin, such as polymethyl methacrylate, polyacrylic acid, or the like. The organic encapsulation layer 320 may be formed by curing monitor or applying polymer.

The touch-screen layer 400 includes a touch electrode, and the touch electrode may include a conductive layer ML. The touch electrode may include the conductive layer ML of a mesh structure surrounding the emission areas of the first and second organic light-emitting diodes OLED1 and OLED2 on a plane. As shown in FIGS. 7 and 8, the conductive layer ML may include a connection structure of a first conductive layer ML1 and a second conductive layer ML2. According to another embodiment, the conductive layer ML may include one of the first conductive layer ML1 and the second conductive layer ML2. The conductive layer ML may include molybdenum (Mo), mendelevium (Mb), silver (Ag), titanium (Ti), copper (Cu), aluminum (Al), or an alloy thereof. An electrode, for example, the conductive layer ML, of the touch-screen layer 400 may be covered by the light-shielding layer 610.

The touch-screen layer 400 may include a first touch insulating layer 401 on the thin-film encapsulation layer 300, a second touch insulating layer 403 on the first touch insulating layer 401, and a third touch insulating layer 405 on the second touch insulating layer 403. The first conductive layer ML1 may be provided between the first touch insulating layer 401 and the second touch insulating layer 403, and the second conductive layer ML2 may be provided between the second touch insulating layer 403 and the third touch insulating layer 405.

The first through third touch insulating layers 401 through 405 may include an inorganic insulating material and/or an organic insulating material. According to an embodiment, the first touch insulating layer 401 and the second touch insulating layer 403 may include an inorganic insulating material, and the third touch insulating layer 405 may include an organic insulating material.

The light-shielding layer 610 of the antireflection layer 600 may include openings overlapping the emission areas of the first and second organic light-emitting diodes OLED1 and OLED2. FIG. 7 illustrates the opening (hereinafter referred to as a fourth opening) 610OP1 overlapping the emission area of the first organic light-emitting diode OLED1 and/or the first opening 123OP1 of the pixel-defining layer 123, and FIG. 8 illustrates the opening (hereinafter, referred to as a fifth opening) 610OP2 overlapping the emission area of the second organic light-emitting diode OLED2 and/or the second opening 123OP2 of the pixel-defining layer 123.

A width of the fourth opening 610OP1 of the light-shielding layer 610 may be equal to or greater than a width of the emission area of the first organic light-emitting diode OLED1 and/or the first opening 123OP1 of the pixel-defining layer 123. FIG. 7 illustrates that the width of the fourth opening 610OP1 of the light-shielding layer 610 is greater than the width of the emission area of the first organic light-emitting diode OLED1 and/or the first opening 123OP1 of the pixel-defining layer 123.

Similarly, a width of the fifth opening 6100P2 of the light-shielding layer 610 may be equal to or greater than the emission area of the second organic light-emitting diode OLED2 and/or the second opening 123OP2 of the pixel-defining layer 123. FIG. 8 illustrates that the width of the fifth opening 6100P2 of the light-shielding layer 610 is greater than the width of the emission area of the second organic light-emitting diode OLED2 and/or the second opening 123OP2 of the pixel-defining layer 123.

The color filter 620 may be located on each of the fourth opening 6100P1 and fifth opening 610OP2 of the light-shielding layer 610. Each color filter 620 may include a same color as light emitted from a light-emitting diode provided below the corresponding color filter 620. For example, as shown in FIG. 7, when the first organic light-emitting diode OLED1 of the first display area DA1 emits green light, the color filter 620 provided on the fourth opening 610OP1 to overlap the first organic light-emitting diode OLED1 may include a green color filter. Similarly, as shown in FIG. 8, when the second organic light-emitting diode OLED2 of the second display area DA2 emits blue light, the color filter 620 provided on the fifth opening 610OP2 to overlap the second organic light-emitting diode OLED2 may include a blue color filter.

The overcoated layer 630 may be provided on the light-shielding layer 610 and color filter 620. The overcoated layer 630 is a transmissive layer without a color of a visible light band, and may flatten an upper surface of the light-shielding layer 610 and an upper surface of the color filter 620. The overcoated layer 630 may include a transmissive organic material, such as an acryl-based resin.

As shown in FIG. 8, the hole region PH may be located between the two adjacent second organic light-emitting diodes OLED2 among the plurality of second organic light-emitting diodes OLED2 provided in the second display area DA2. The hole region PH may be a region of a certain area where light-shielding elements, such as circuit devices and/or wires connected thereto, are not arranged.

So as to identically maintain a resolution of the second display area DA2 and a resolution of the first display area DA1 and form the hole region PH in the second display area DA2, an interval between the pixel circuit devices and/or the wires WL connected thereto in the second display area DA2 may be less than an interval between the pixel circuit devices and/or the wires WL connected thereto in the first display area DA1.

The pixel-defining layer 123 may include an opening (hereinafter, referred to as a third opening) 123OP3 corresponding to the hole region PH, and the light-shielding layer 610 may also include the opening (hereinafter, referred to as a sixth opening) 610OP3 corresponding to the hole region PH. The color filter 620 is not provided in the sixth opening 610OP3 and a portion of the overcoated layer 630 may be located in the sixth opening 610OP3. For example, the overcoated layer 630 may at least partially fill the sixth opening 610OP3 and entirely cover the light-shielding layer 610 and color filters 620. The sixth opening 610OP3 may overlap the third opening 123OP3 while a size (or width) of the sixth opening 610OP3 is greater than a size (or width) of the third opening 123OP3.

The first and second functional layers 221 and 223 may also be present in a portion corresponding to the hole region PH. Meanwhile, the second electrode 230 including a metal element may include an opening (hereinafter, referred to as a seventh opening) 230OP corresponding to the hole region PH. Transmittance of the hole region PH may be enhanced by the seventh opening 230OP. A size (or width) of the seventh opening 230OP of the second electrode 230 may be less than a size (or width) of the third opening 123OP3.

The blocking metal layer BML may include an opening (hereinafter, referred to as a ninth opening) BML_OP overlapping the hole region PH, wherein a size (or width) of the ninth opening BML_OP may be greater than a size (or width) of the third opening 123OP3.

According to an embodiment, an interval between the first conductive layers ML1 and an interval between the second conductive layers ML2 of the touch-screen layer 400 in the second display area DA2 may be different from an interval between the first conductive layers ML1 and an interval between the second conductive layers ML2 in the first display area DA1 such that a region corresponding to the hole region PH is defined in the touch-screen layer 400 in the second display area DA2. For example, in the second display area DA2, an interval between the first conductive layers ML1 and an interval between the second conductive layers ML2 of the touch-screen layer 400 may be less than the interval between the first conductive layers ML1 and the interval between the second conductive layers ML2 in the first display area DA1.

A pixel circuit, a wire, and the pixel-defining layer 123 and light-shielding layer 610 of an opaque material are not provided in a region of the display panel corresponding to the hole region PH, and thus the resolution of the second display area DA2 and the resolution of the first display area DA1 are maintained to be the same while enhancing the transmittance of the second display area DA2.

Figure 9:
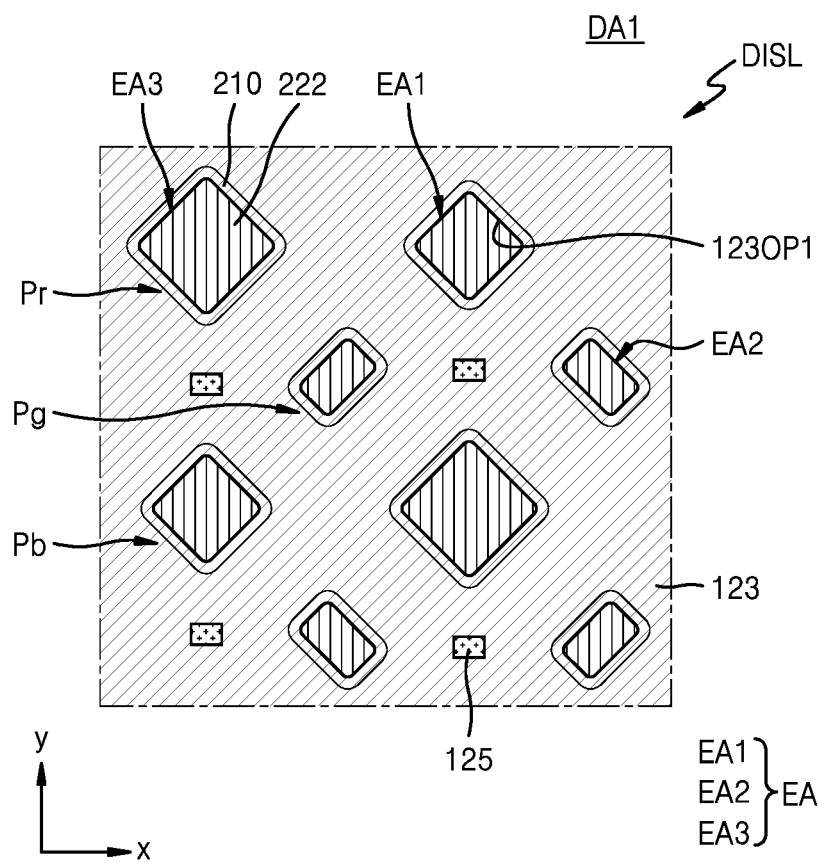
FIG. 9 is a plan view of a display layer of a first display area of FIG. 6.
Figure 10A:
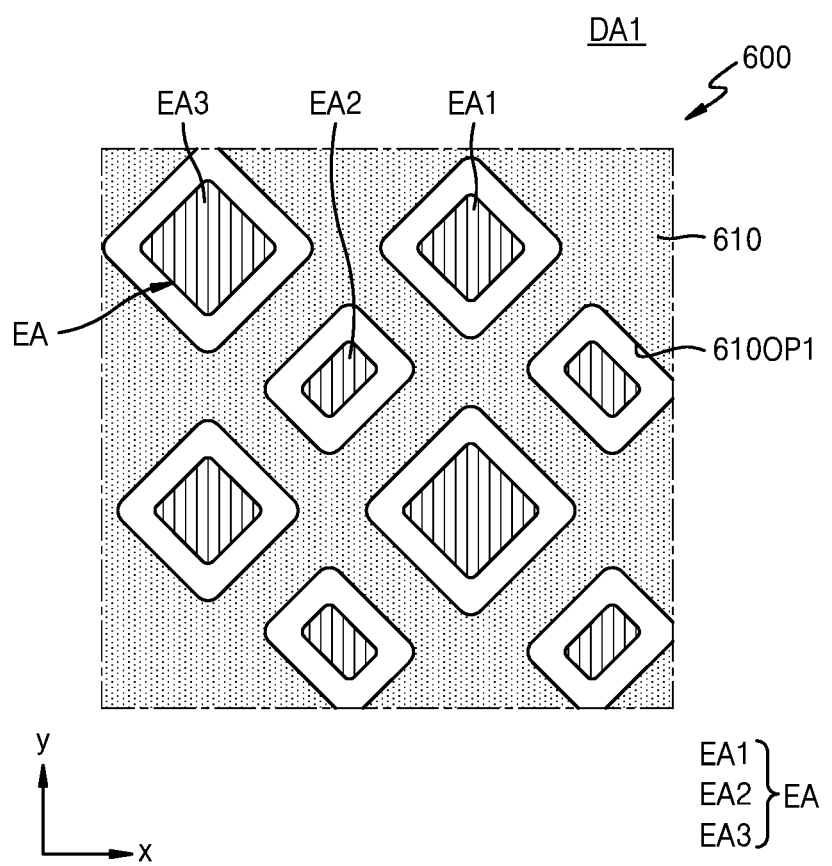
FIGS. 10A and 10B are plan views of an antireflection layer in a first display area.
Figure 10B:
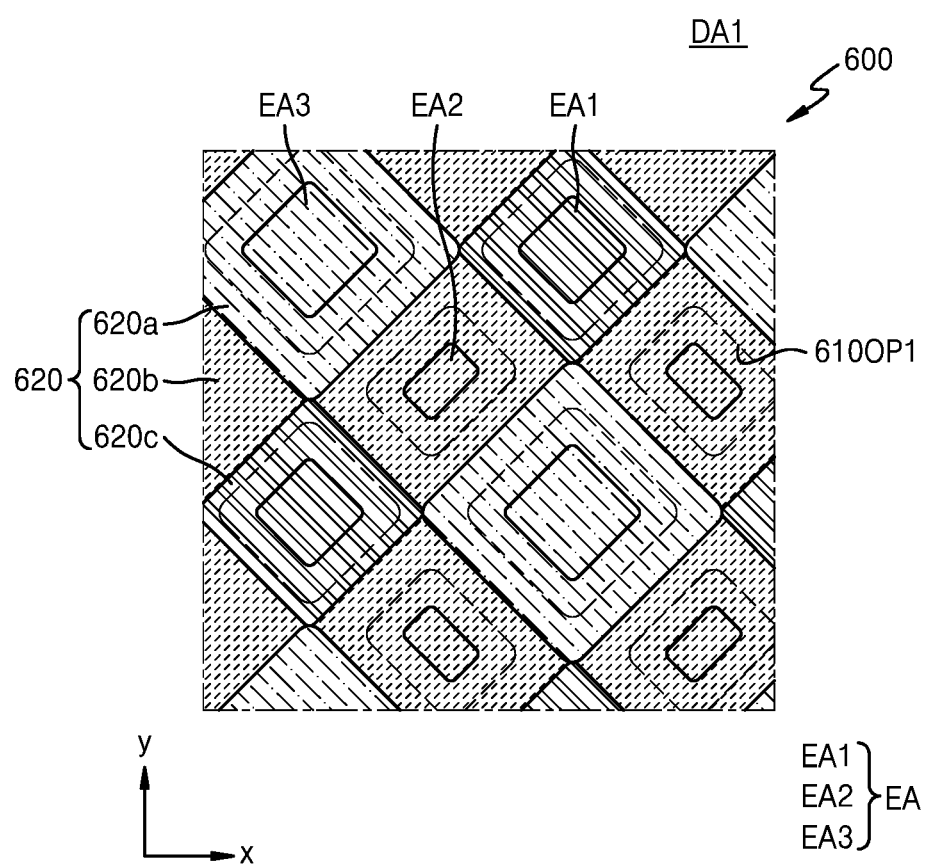

FIG. 9 is a plan view of the display layer DISL of the first display area DA1 of FIG. 6. FIGS. 10A and 10B are plan views of the antireflection layer 600 in the first display area DA1.

Referring to FIG. 9, the first electrode 210 of each of the red pixel Pr, green pixel Pg, and blue pixel Pb may be provided on the planarization layer 121 of the first display area DA1. The pixel-defining layer 123 covering an edge of the first electrodes 210 may be provided between the first electrodes 210. The pixel-defining layer 123 may include the first openings 123OP1 exposing portions of the first electrodes 210. The emission layer 222 may be arranged in the first openings 123OP1 and an emission area EA corresponding to the emission layer 222 may be defined. The emission area EA may include a first emission area EA1 corresponding to the red pixel Pr, a second emission area EA2 corresponding to the green pixel Pg, and a third emission area EA3 corresponding to the blue pixel Pb. The spacer 125 may be provided between the emission areas EA on the pixel-defining layer 123.

Referring to FIG. 10A, the light-shielding layer 610 may surround the emission area EA and be located to correspond to the pixel-defining layer 123. The light-shielding layer 610 may include the fourth opening 610OP1 corresponding to the emission area EA. A size of the fourth opening 610OP1 may be greater than a size of the emission area EA.

Referring to FIG. 10B, the color filter 620 may include a first color filter 620a selectively transmitting only red light, a second color filter 620b selectively transmitting only green light, and a third color filter 620c selectively transmitting only blue light. The first color filter 620a may be arranged to correspond to the first emission area EA1, the second color filter 620b may be arranged to correspond to the second emission area EA2, and the third color filter 620c may be arranged to correspond to the third emission area EA3. The first color filter 620a, the second color filter 620b, and the third color filter 620c may be adjacent to each other. According to an embodiment, an edge of each of the first color filter 620a, second color filter 620b, and third color filter 620c may overlap a portion of the light-shielding layer 610. The edge of each of the first color filter 620a, second color filter 620b, and third color filter 620c may overlap an edge of the adjacent first color filter 620a, second color filter 620b, or third color filter 620c. Each of the first color filter 620a, second color filter 620b, and third color filter 620c may have an independent pattern structure. The first color filter 620a, the second color filter 620b, and the third color filter 620c may each partially overlap the pixel-defining layer 123.

Figure 11:
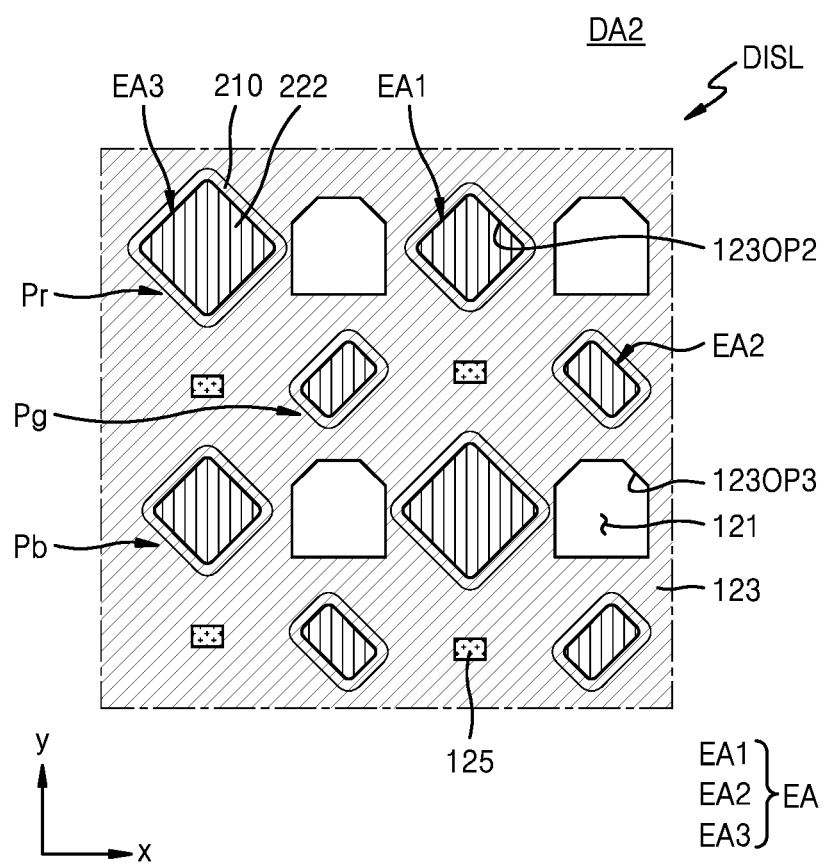
FIG. 11 is a plan view of a display layer of a second display area of FIG. 6.
Figure 12A:
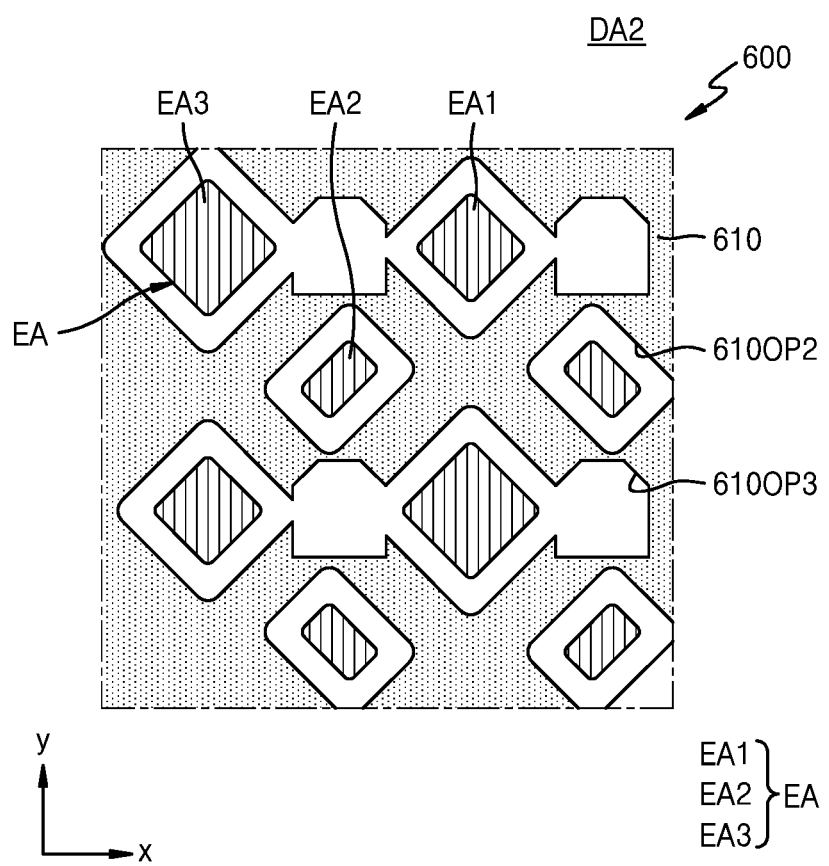
FIGS. 12A and 12B are plan views of an antireflection layer in a second display area.
Figure 12B:
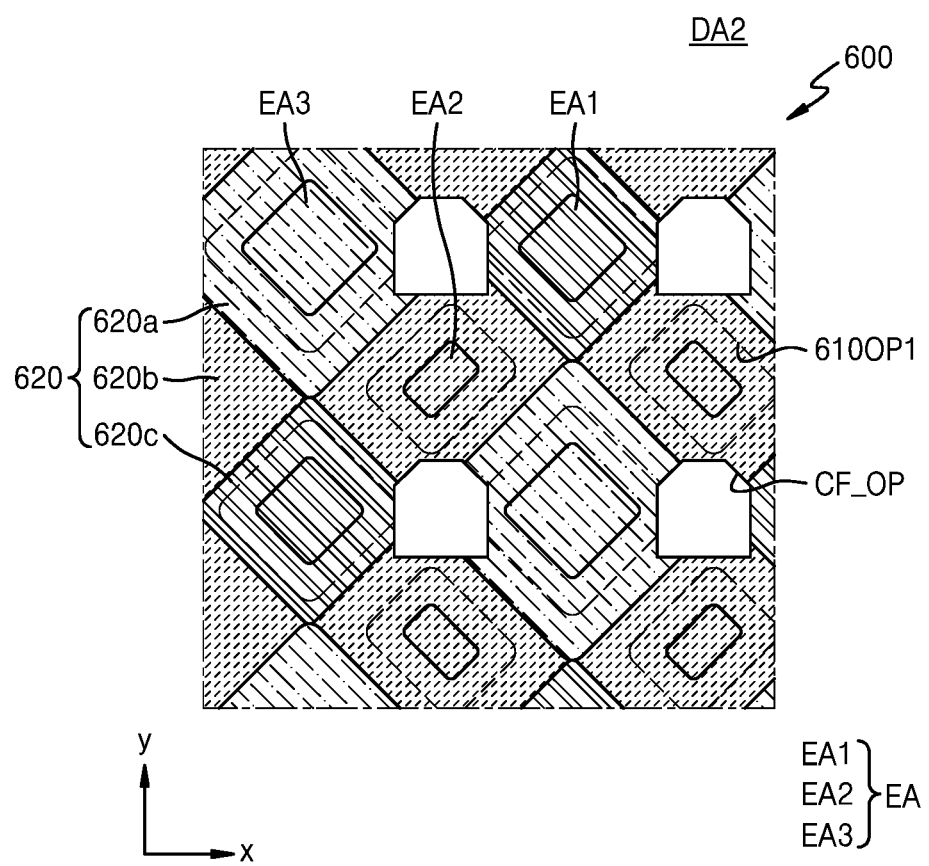

FIG. 11 is a plan view of the display layer DISL of the second display area DA2 of FIG. 6. FIGS. 12A and 12B are plan views of the antireflection layer 600 in the second display area DA2.

Referring to FIG. 11, the first electrode 210 of each of the red pixel Pr, green pixel Pg, and blue pixel Pb may be provided on the planarization layer 121 of the second display area DA2. The pixel-defining layer 123 covering the edge of the first electrodes 210 may be provided between the first electrodes 210. The pixel-defining layer 123 may include the second openings 123OP2 exposing portions of the first electrodes 210. The emission layer 222 may be arranged in the second openings 123OP2 and the emission area EA corresponding to the emission layer 222 may be defined. The emission area EA may include the first emission area EA1 corresponding to the red pixel Pr, the second emission area EA2 corresponding to the green pixel Pg, and the third emission area EA3 corresponding to the blue pixel Pb. The pixel-defining layer 123 may include the third opening 123OP3 corresponding to the hole region PH. The third opening 123OP3 may expose a portion of the planarization layer 121 therebelow. The spacer 125 may be provided between the emission areas EA on the pixel-defining layer 123. A shape of the third opening 123OP3 of the pixel-defining layer 123 corresponds to a shape of the hole region PH, and in FIG. 11, the third opening 123OP3 of the pixel-defining layer 123 is polygonal.

Referring to FIG. 12A, the light-shielding layer 610 may surround the emission area EA and be located to correspond to the pixel-defining layer 123. The light-shielding layer 610 may include the fifth opening 610OP2 corresponding to the emission area EA. A size of the fifth opening 610OP2 may be greater than a size of the emission area EA. The light-shielding layer 610 may cover the first conductive layer ML1 and the second conductive layer ML2. The light-shielding layer 610 may include the sixth opening 610OP3 corresponding to the hole region PH. The sixth opening 610OP3 of the light-shielding layer 610 may overlap the third opening 123OP3 of the pixel-defining layer 123. A shape of the sixth opening 610OP3 of the light-shielding layer 610 corresponds to a shape of the hole region PH, and in FIG. 12A, the sixth opening 610OP3 is polygonal. As shown in FIG. 12A, the sixth opening 610OP3 may be connected to the fifth opening 610OP2.

Referring to FIG. 12B, the color filter 620 may include an opening CF_OP corresponding to the hole region PH. The opening CF_OP corresponds to the sixth opening 610OP3 of the light-shielding layer 610 and may overlap the sixth opening 610OP3. The first color filter 620a may be arranged to correspond to the first emission area EA1, the second color filter 620b may be arranged to correspond to the second emission area EA2, and the third color filter 620c may be arranged to correspond to the third emission area EA3. The first color filter 620a, the second color filter 620b, and the third color filter 620c may be adjacent to each other. According to an embodiment, the edge of each of the first color filter 620a, second color filter 620b, and third color filter 620c may overlap the edge of the adjacent first color filter 620a, second color filter 620b, or third color filter 620c. The edge of each of the first color filter 620a, second color filter 620b, and third color filter 620c may overlap the portion of the light-shielding layer 610. Each of the first color filter 620a, second color filter 620b, and third color filter 620c may have an independent pattern structure. The first color filter 620a, the second color filter 620b, and the third color filter 620c may each partially overlap the pixel-defining layer 123.

Figure 13:
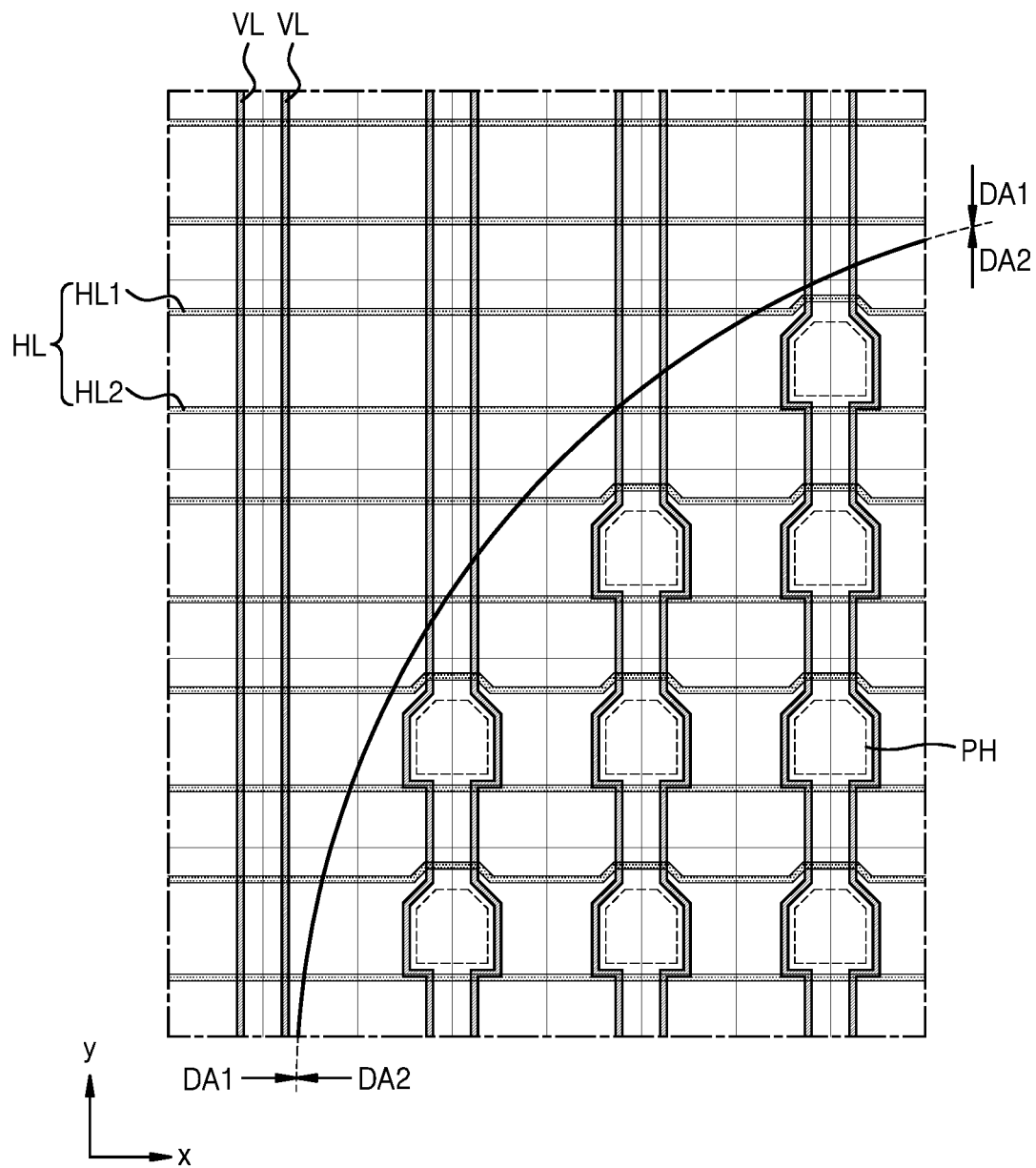
FIG. 13 illustrates wires arranged in a display area of a display panel, according to an embodiment.

FIG. 13 illustrates wires arranged in a display area of a display panel, according to an embodiment.

Referring to FIG. 13, a plurality of horizontal wires HL extending in an x-axis direction may be spaced apart from each other at certain intervals along a y-axis direction in row units, in the first display area DA1 and second display area DA2. In the first display area DA1 and second display area DA2, a plurality of vertical wires VL extending in the y-axis direction may be spaced apart from each other at certain intervals along the x-axis direction in column units.

Among the plurality of horizontal wires HL, some horizontal wires HL passing the second display area DA2 may extend while bypassing the hole region PH. The horizontal wires HL may include a first horizontal wire HL1 provided on an upper portion of the hole region PH and a second horizontal wire HL2 provided on a lower portion of the hole region PH. Similarly, among the plurality of vertical wires VL, some vertical wires VL passing the second display area DA2 may extend while bypassing the hole region PH. The hole region PH may be a space defined as light-shielding elements, such as circuit devices and/or the horizontal wires HL and vertical wires VL connected thereto, are not arranged.

The horizontal wire HL of FIG. 13 may be an emission control line and/or at least one of first through fourth scan lines of FIGS. 5A and 5B, and the vertical wire VL may be a data line and/or a driving voltage line of FIGS. 5A and 5B.

Figure 14:
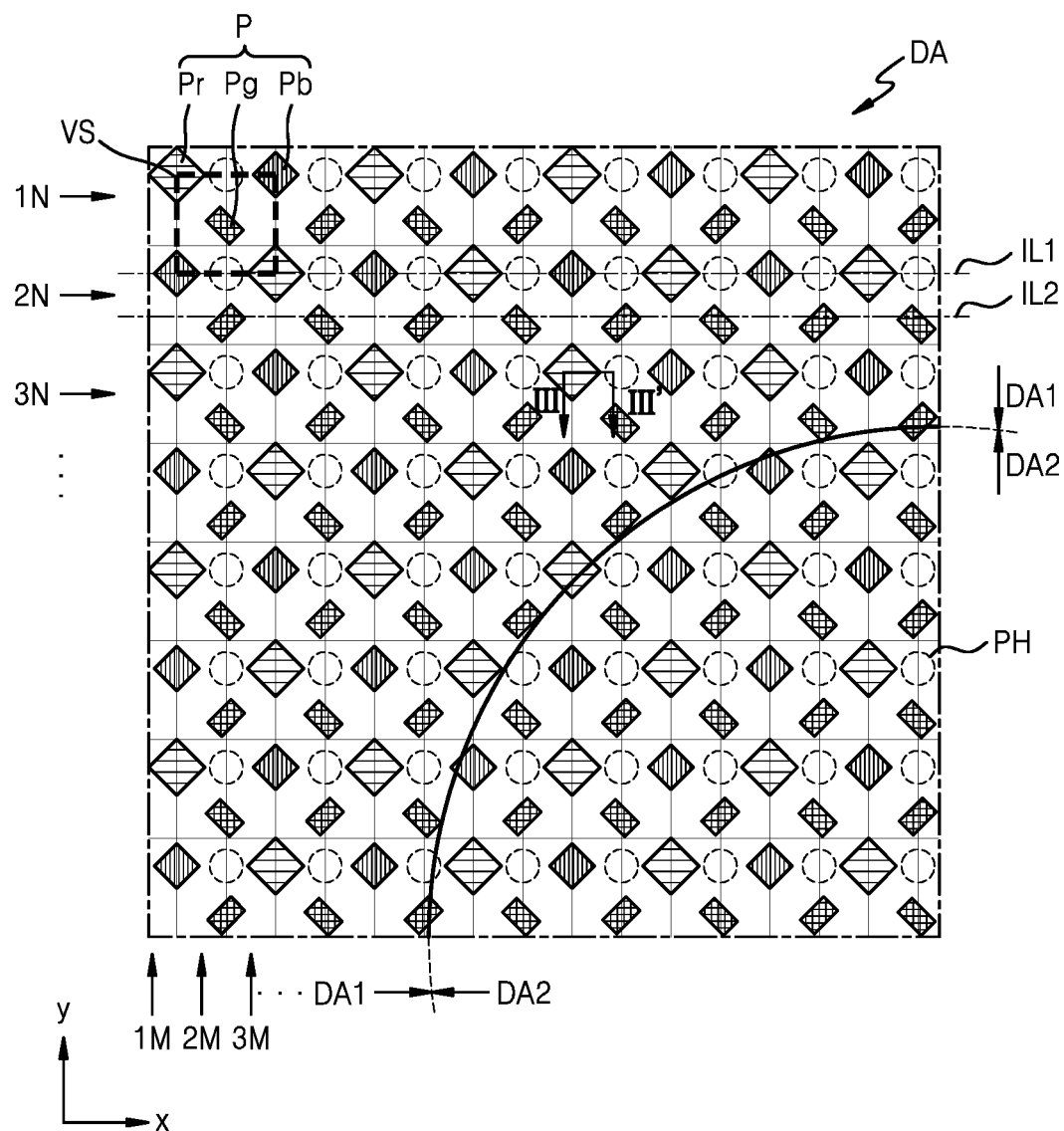
FIG. 14 is a plan view of a portion of a display area of a display apparatus, according to an embodiment.
Figure 15:
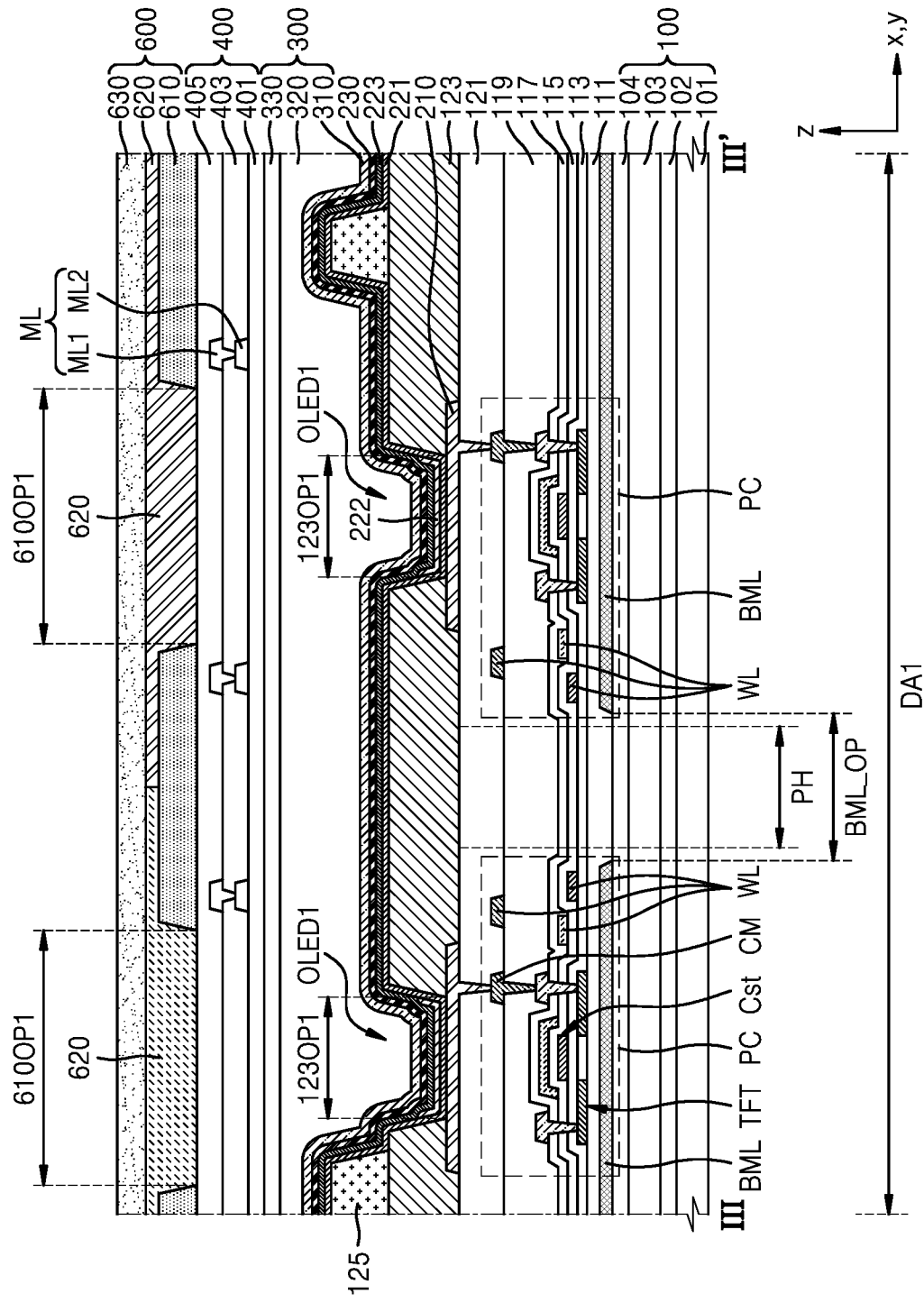
FIG. 15 is a cross-sectional view of the display apparatus taken along a line of FIG. 14.
Figure 16:
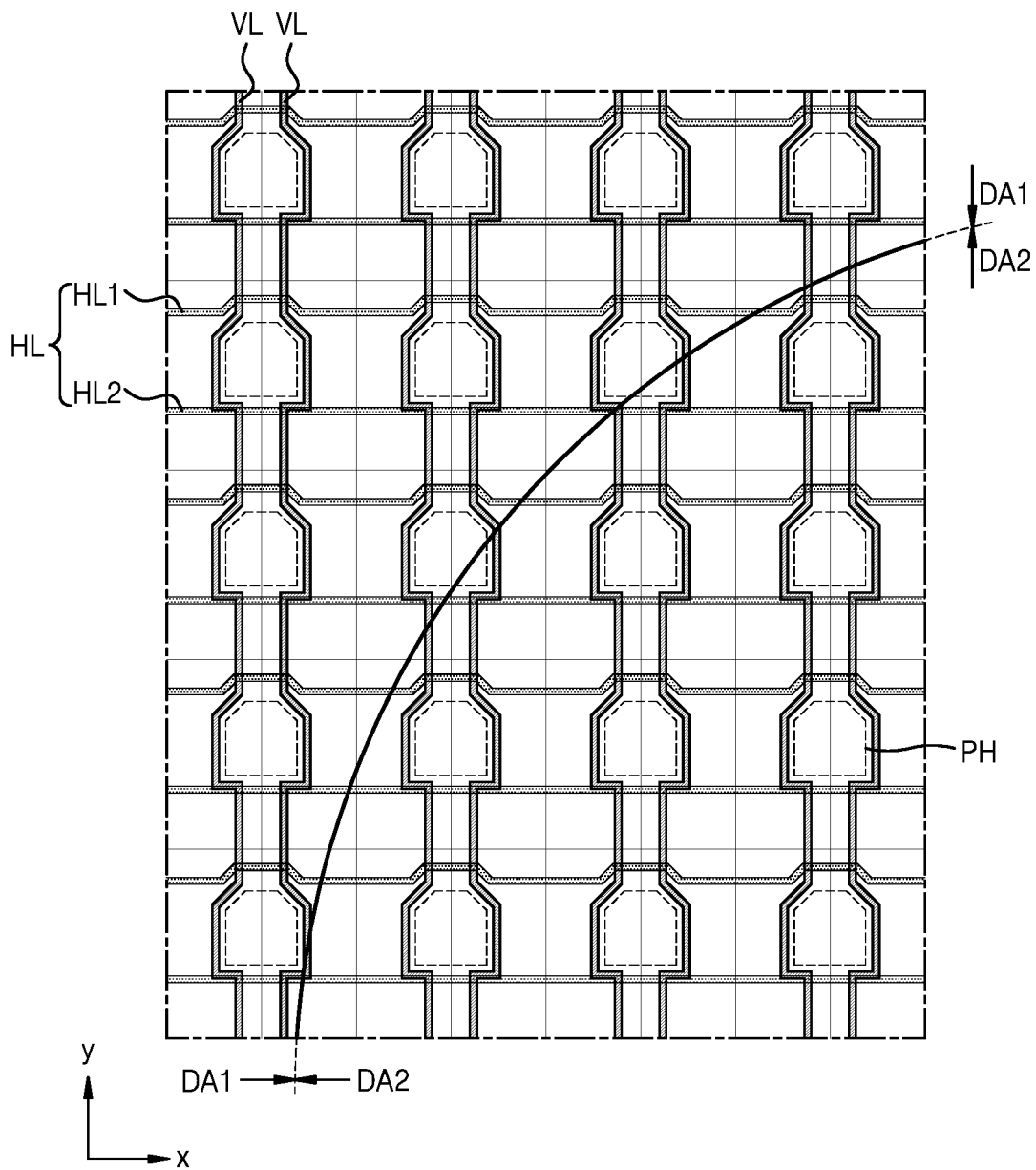
FIG. 16 illustrates wires arranged in a display area of a display panel in the display apparatus of FIG. 14.

FIG. 14 is a plan view of a portion of the display area DA of a display apparatus, according to an embodiment. FIG. 15 is a cross-sectional view of the display apparatus taken along a line of FIG. 14. FIG. 16 illustrates wires arranged in the display area DA of a display panel in the display apparatus of FIG. 14.

The display apparatus according to an embodiment of FIGS. 14 through 16 is the same as the display apparatus described with reference to FIGS. 6 through 13, except that the hole regions PH are also located in the first display area DA1 in addition to the second display area DA2. Hereinafter, differences will be mainly described.

As shown in FIG. 14, the plurality of hole regions PH may be regularly located in the first display area DA1 and second display area DA2 at certain intervals. The hole regions PH may be defined between the two adjacent first organic light-emitting diodes OLED1 arranged in the first display area DA1, and between the two adjacent second organic light-emitting diodes OLED2 arranged in the second display area DA2.

As shown in FIG. 16, the plurality of horizontal wires HL may each extend while bypassing the hole region PH in the first display area DA1 and second display area DA2. Similarly, the plurality of vertical wires VL may each extend while bypassing the hole region PH in the first display area DA1 and second display area DA2.

In the second display area DA2, as shown in FIG. 8, the pixel-defining layer 123 may include the third opening 123OP3 corresponding to the hole region PH, the light-shielding layer 610 may include the sixth opening 610OP3 corresponding to the hole region PH, and the second electrode 230 may include the seventh opening 230OP corresponding to the hole region PH.

On the other hand, in the first display area DA1, as shown in FIG. 15, the pixel-defining layer 123, the light-shielding layer 610, and the second electrode 230 do not include an opening corresponding to the hole region PH.

In the display apparatus according to an embodiment of FIG. 14, a phenomenon in which the second display area DA2 is viewed differently from the first display area DA1 may be reduced because arrangements of wires and circuit devices of the pixel circuits are the same in the first display area DA1 and second display area DA2.

According to embodiments of the inventive concepts, image quality may be retained because pixel resolutions of a first display area and second display area are identically maintained while enabling transmittance of the second display area, and visibility of the second display area is reduced.

As described above, a display panel and a display apparatus according to embodiments may enable transmittance of light/signals in a region where a component is arranged by differently configuring a wire arrangement, a pixel-defining layer, and an antireflection layer in the region where the component is arranged as compared to other regions. However, the scope of the inventive concepts is not limited by such effects.

Although certain embodiments and implementations have been described herein, other embodiments and modifications will be apparent from this description. Accordingly, the inventive concepts are not limited to such embodiments, but rather to the broader scope of the appended claims and various obvious modifications equivalent arrangements as would be apparent to a person of ordinary skill in the art.

What is claimed is:

1. A display panel comprising:
    a first display area comprising first light-emitting diodes and first pixel circuits connected to the first light-emitting diodes disposed therein;
    a second display area at least partially surrounded by the first display area and comprising second light-emitting diodes and second pixel circuits connected to the second light-emitting diodes disposed therein;
    a pixel-defining layer defining an emission area of each of the first light-emitting diodes and the second light-emitting diodes; and
    an antireflection layer arranged on the first light-emitting diodes and the second light-emitting diodes and including a light-shielding layer and color filters,
    wherein:
    hole regions are disposed between the second light-emitting diodes in the second display area,
    the pixel-defining layer and the light-shielding layer include openings respectively corresponding to the hole regions, and
    circuit devices forming the second pixel circuits and wires connected to the second pixel circuits are disposed in the second display area but are not disposed in each of the hole regions.

2. The display panel of claim 1, wherein the pixel-defining layer includes a light-shielding insulating layer.

3. The display panel of claim 1, wherein the pixel-defining layer comprises first openings corresponding to the first light-emitting diodes, second openings corresponding to the second light-emitting diodes, and third openings corresponding to the hole regions, and
    the light-shielding layer comprises fourth openings overlapping the first openings, fifth openings overlapping the second openings, and sixth openings overlapping the third openings.

4. The display panel of claim 3, wherein the color filters are located at the fourth openings and the fifth openings.

5. The display panel of claim 4, wherein the antireflection layer further comprises an overcoated layer arranged on the light-shielding layer and the color filters, wherein at least a portion of the overcoated layer is located at the sixth openings.

6. The display panel of claim 3, wherein each of the first light-emitting diodes and the second light-emitting diodes comprises:
    a first electrode;
    an emission layer on the first electrode; and
    a second electrode on the emission layer, wherein the second electrode is integrated to correspond to the first light-emitting diodes and the second light-emitting diodes.

7. The display panel of claim 6, wherein the second electrode comprises openings corresponding to the hole regions.

8. The display panel of claim 1, wherein a resolution of the first display area is same as a resolution of the second display area.

9. A display panel comprising:
a first display area having first light-emitting diodes and first pixel circuits connected to the first light-emitting diodes disposed therein;
a second display area at least partially surrounded by the first display area and having second light-emitting diodes and second pixel circuits connected to the second light-emitting diodes disposed therein;
a pixel-defining layer defining an emission area of each of the first light-emitting diodes and the second light-emitting diodes; and
an antireflection layer disposed on the first light-emitting diodes and the second light-emitting diodes and including a light-shielding layer and color filters,
wherein:
hole regions are disposed between the first light-emitting diodes and between the second light-emitting diodes in the first display area and the second display area,
the pixel-defining layer includes openings corresponding to the hole regions of the first display area and the second display area,
the light-shielding layer includes openings corresponding to the hole regions of the second display area, and
first circuit devices forming the first pixel circuits and wires connected to the first pixel circuits are disposed in the first display area but are not disposed in each of the hole regions of the first display area, and second circuit devices forming the second pixel circuits and wires connected to the second pixel circuits are disposed in the second display area but are not disposed in each of the hole regions of the second display area.

10. The display panel of claim 9, wherein the pixel-defining layer includes a light-shielding insulating layer.

11. The display panel of claim 9, wherein the pixel-defining layer comprises first openings corresponding to the first light-emitting diodes, second openings corresponding to the second light-emitting diodes, and third openings corresponding to the hole regions, and
the light-shielding layer comprises fourth openings overlapping the first openings, fifth openings overlapping the second openings, and sixth openings overlapping the third openings of the second display area.

12. The display panel of claim 11, wherein the color filters are located at the fourth openings and the fifth openings.

13. The display panel of claim 12, wherein the antireflection layer further comprises an overcoated layer arranged on the light-shielding layer and the color filters, wherein at least a portion of the overcoated layer is located at the sixth openings.

14. The display panel of claim 11, wherein each of the first light-emitting diodes and the second light-emitting diodes comprises:
a first electrode;
an emission layer on the first electrode; and
a second electrode on the emission layer,
wherein the second electrode is integrated to correspond to the first light-emitting diodes and the second light-emitting diodes.

15. The display panel of claim 14, wherein the second electrode comprises openings corresponding to the hole regions.

16. The display panel of claim 9, wherein a resolution of the first display area is same as a resolution of the second display area.

17. A display apparatus comprising:
a display panel comprising a first display area where first light-emitting diodes are arranged and a second display area where second light-emitting diodes are arranged; and
a component arranged on a lower surface of the display panel and overlapping the second display area,
wherein the display panel comprises:
a pixel-defining layer defining an emission area of each of the first light-emitting diodes and the second light-emitting diodes; and
an antireflection layer arranged on the first light-emitting diodes and the second light-emitting diodes and including a light-shielding layer and color filters,
wherein first hole regions are defined between the second light-emitting diodes in the second display area,
the pixel-defining layer and the light-shielding layer include openings respectively corresponding to the first hole regions, and
first circuit devices forming second pixel circuits and wires connected to the second pixel circuits are disposed in the second display area but are not disposed in each of the first hole regions.

18. The display apparatus of claim 17, wherein the pixel-defining layer includes a light-shielding insulating layer.

19. The display apparatus of claim 17, wherein second hole regions are further defined between the first light-emitting diodes in the first display area,
the pixel-defining layer further includes openings corresponding to the second hole regions,
the light-shielding layer does not include openings corresponding to the second hole regions, and
second circuit devices forming first pixel circuits and wires connected to the first pixel circuits are disposed in the first display area but are not disposed in each of the second hole regions.

20. The display apparatus of claim 19, wherein the pixel-defining layer comprises first openings corresponding to the first light-emitting diodes, second openings corresponding to the second light-emitting diodes, and third openings corresponding to the first hole regions and the second hole regions,
the light-shielding layer comprises fourth openings overlapping the first openings, fifth openings overlapping the second openings, and sixth openings overlapping the third openings of the second display area,
the color filters are located at the fourth openings and the fifth openings, and
the antireflection layer further comprises an overcoated layer arranged on the light-shielding layer and the color filters, wherein at least a portion of the overcoated layer is located at the sixth openings.

\* \* \* \* \*